(12) United States Patent
Wyland

(10) Patent No.: US 8,237,516 B2
(45) Date of Patent: Aug. 7, 2012

(54) ENHANCED SUBSTRATE USING METAMATERIALS

(75) Inventor: Chris Wyland, Livermore, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 410 days.

(21) Appl. No.: 12/097,128

(22) PCT Filed: Dec. 15, 2006

(86) PCT No.: PCT/IB2006/054899
§ 371 (c)(1),
(2), (4) Date: Jun. 12, 2008

(87) PCT Pub. No.: WO2007/069224
PCT Pub. Date: Jun. 21, 2007

(65) Prior Publication Data
US 2008/0266028 A1    Oct. 30, 2008

Related U.S. Application Data

(60) Provisional application No. 60/751,095, filed on Dec. 15, 2005.

(51) Int. Cl.
*H04B 3/54* (2006.01)
*H01P 1/203* (2006.01)
(52) U.S. Cl. .......................... 333/12; 333/202; 333/236
(58) Field of Classification Search .............. 333/12, 333/202, 219, 204, 236, 238, 246, 245
See application file for complete search history.

(56) References Cited

U.S. PATENT DOCUMENTS 6,853,350 B2 * 2/2005 Alexopoulos et al. ........ 343/895
2005/0212625 A1 9/2005 Celinski et al.

FOREIGN PATENT DOCUMENTS

WO      03030298 A1    4/2003

OTHER PUBLICATIONS

European Patent Office, Oral Proceedings dated Jun. 22, 2011, Application No. 06842564.4-2220/1964174, 9 pages.

(Continued)

*Primary Examiner* — Robert Pascal
*Assistant Examiner* — Kimberly Glenn
(74) *Attorney, Agent, or Firm* — Haynes and Boone, LLP

(57) ABSTRACT

In enhancing signal quality through packages, meta-materials may be used. Meta-materials are designed to make the signal act in such a way as to make the shape of the signal behave as though the permittivity and permeability are different than the real permittivity and permeability of the insulator used. In an example embodiment, a substrate (10) is configured as a meta-material. The meta-material provides noise protection for a signal line (15) having a pre-determined length disposed on the meta-material. The substrate comprises a dielectric material (2, 4, 6) having a topside surface and an underside surface. A conductive material (30) is arranged into pre-determined shapes (35) having a collective length. Dielectric material envelops the conductive material and the conductive material is disposed at a first predetermined distance (55) from the topside surface and at a second predetermined distance from the underside surface. The collective length of the conductive material (30) is comparable to the pre-determined length of the signal line (15).

22 Claims, 20 Drawing Sheets

OTHER PUBLICATIONS

Cheng, C-Y; et al "Tailoring Double-Negative Metamaterial Responses to Achieve Anomalous Propagation Effects Along Microstrip Transmission Lines" IEEE Transactions on Microwave Theory and Techniques, vol. 51, No. 12, Dec. 2003, pp. 2306-2314.

Shelby, R. A; et al "Microwave Transmission Through a Two-Dimensional, Isotropic, Left-Handed Metamaterial" Applied Physics Letters, AIP, American Institute of Physics, vol. 78, No. 4, Jan. 22, 2001, pp. 489-491.

Ziolkowski, R. W.: "Design, Fabrications, and Testing of Double Negative Metamaterials" IEEE Transactions on Antennas and Propagation, vol. 51, No. 7, Jul. 2003, pp. 1516-1529.

Gil, I; et al "Metamaterials in Microstrip Technology for Filter Applications" Antennas and Propagation Society Symposium, 2005. IEEE Washington DC, Jul. 3, 2005, pp. 668-671 vol. 1A.

Wyland, Chris "Use of Negative Permeability Metamaterials to Improve Signal Impedance" IEEE Workshop on Signal Propagation on Interconnects, May 2006, pp. 287-289.

Starr, A. F; "Fabrication and Characterization of a Negative-Refractive-Index Composite Metamaterial" Physical Review B 70, American Physical Society, 2004.

Nederlandsch Octrooibureau, Response to Official Communication from the European Patent Office filed Feb. 11, 2009, Application No. 06842564.4, 36 pages.

* cited by examiner

Zo = 83R
v = 150M m/s
L = 0.014m

ENHANCED SUBSTRATE USING METAMATERIALS

The invention relates to integrated circuit (IC) packaging. More particularly this invention relates to the use of meta-materials in a packaging substrate to reduce noise that may be present on a signal line.

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured with various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

After undergoing the process of fabrication, the silicon wafer has a predetermined number of devices. These devices are tested. Good devices are collected and packaged.

As more performance and functionality is built into IC devices, the sending of signals internal to the IC and to other components on the IC's periphery becomes a challenge. When sending a signal from one chip to another, the signal must usually travel through a variety of interconnect such as a package, a printed circuit board and a socket. Generally, the impedance of signal lines through these entities differs from one another. The impedance mismatch causes noise on the line owing to reflections of energy at the impedance boundaries. Upon the inter-connect this energy initiates a resonant response. This resonance is typically at a different frequency and time than that of the signal and is interpreted as noise in the circuit.

A. F. Starr et al. write in their paper titled, "Fabrication and Characterization of a Negative-Refractive-Index Composite Meta-material," *Physical Review B* 70, 113102 (2004) of the American Physical Society, "while there have not been many suggested paths toward the design of a material whose effective index-of-refraction is negative, a rigorous approach is to design a material whose electric permittivity ($\in$) and magnetic permeability ($\mu$) are simultaneously negative . . . . While there are no known naturally occurring materials or compounds that exhibit simultaneously negative $\in$ and $\mu$, artificially structure materials can be designed whose effective $\in$ and $\mu$ as derived from effective medium arguments, are both negative over a finite frequency band."

Such a meta-material in which the permittivity and permeability of a packaging substrate could be influenced in a negative direction finds a potential role in high performance IC devices. Consequently, there is exists a need to minimize noise at the impedance boundaries of an IC device in a cost-effective manner.

This invention has been found useful in enhancing signal quality through packages by using meta-materials for the insulator of the substrate. Meta-materials are materials which are designed to make the signal act in such a way as to make the shape of the signal behave as though the permittivity and permeability are different than the real component permittivity and permeability of the insulator used. It should be noted that the relative permittivity and relative permeability include both real and imaginary components, that is $\in_R = \in_R + j\in_R$ and $\mu_R = \mu_R + j\mu_R$ It is possible to design meta-materials so as to have the signal respond as if the permittivity and permeability have negative values. In this invention, an insulator material is designed to reduce the noise present from the resonant mode of the signal line. The meta-material is an arrangement of conductors in the insulator that reduces the resonant response of the line on the signal.

In an example embodiment, a substrate is configured as a meta-material. The meta-material provides noise protection for a signal line having a pre-determined length disposed on the meta-material. The substrate comprises a dielectric material having a topside surface and an underside surface. A conductive material is arranged into pre-determined shapes having a collective length. Dielectric material envelops the conductive material and the conductive material is disposed at a first predetermined distance from the topside surface and at a second predetermined distance from the underside surface. The collective length of the conductive material is comparable to the pre-determined length of the signal line.

In another example embodiment, there is a substrate having a topside surface and an underside surface, the substrate configured as a meta-material, the meta-material providing noise protection for a signal line of pre-determined dimensions defined on the topside surface. The substrate comprises a conductive voltage reference plane defining the underside surface of the substrate. A layer of conductive lines is configured into pre-determined shapes. The layer of conductive lines is disposed above the metal ground plane at a first pre-determined distance and the layer of conductive lines is disposed at a second pre-determined distance below the signal line defined on the topside surface of the substrate. A dielectric material envelops the layer of conductive lines; the dielectric material is bounded between the topside surface and underside surface of the substrate. The collective dimensions of the conductive lines are comparable to the pre-determined dimensions of the signal line.

In yet another example embodiment, there is a substrate having a topside surface and an underside surface, the substrate is configured as a meta-material. The meta-material provides noise protection for a signal line of pre-determined dimensions defined on the topside surface. The substrate comprises a conductive ground plane defining the underside surface of the substrate. There is a layer of conductive material configured into a plurality of pre-determined shapes wherein some conductive material is absent. The layer of conductive material is disposed above the conductive ground plane at a first pre-determined distance and the layer of the conductive material disposed at a second pre-determined distance below the signal line defined on the topside surface of the substrate. A dielectric material envelops the layer of the conductive material and the dielectric material is bounded between the topside surface and underside surface of the substrate. The collective dimensions of the plurality of pre-determined shapes are comparable to the pre-determined dimensions of the signal line In another example embodiment, there is a substrate having a topside surface and an underside surface, the substrate configured as a meta-material, the meta-material providing noise protection for a signal line of pre-determined dimensions defined on the topside surface. The substrate comprises a conductive ground plane defining the underside surface of the substrate. A layer of a conductive material is configured into two concentric rectangles; each rectangle has a notch defined on a side about a midpoint and the notch in a first rectangle is opposite the notch in a second rectangle; the first rectangle has a smaller perimeter than the second rectangle. The layer of conductive material is disposed above the conductive ground plane at a first pre-determined distance and the layer of the conductive material is disposed at a second pre-determined distance below the signal line defined on the topside surface of the substrate. A dielectric material envelops the layer of the conductive material; the dielectric material is bounded between the topside surface and underside surface of the substrate. The collective dimensions of the two concentric rectangles are comparable to the pre-determined dimensions of the signal line. A feature of this embodiment includes, the layer of a conductive material having an additional inside rectangle having a smaller perimeter than the first rectangle and an additional four outside rectangles each having an incrementally greater perimeter than the perimeter of the second rectangle.

In another example embodiment, there is a method of designing a meta-material using resistance-inductance-capacitance (RLC) data from two-dimensional electromagnetic meta-material (EM) models, the meta-material being a structure having a rectangular-like shape. The method comprises, defining desired application parameters for the structure and constructing a tank circuit. RLC values in the tank circuit are selected to obtain a desired signal response and determining a configuration of corresponding geometries. To find desired RLC tank circuit values, two-dimensional cross-sections of the structure are simulated. Equivalent RLC values for a structure length and on e of the two-dimensional cross-sections are calculated.

In another example embodiment, for a meta-material, there is a method of calculating the distances between layers of conductive material with a two-dimensional EM model, the layers of conductive material, a signal transmission line on a first plane, a layer of three rectangular conductive segments in a second plane, and a ground layer on a third plane. The method comprises defining dimensions of width, length, thickness of the layers of conductive material wherein; defining the dimensions includes, defining a first distance from the signal transmission line to the layer of three rectangular conductive segments, defining a second distance from the layer of three rectangular conductive segments from the ground layer, and defining a third distance between each of the three rectangular conductive segments. At varying first, second and third distances, LC parameters are simulated. LC plots of unit capacitance and inductance of the meta-material at the varying distances between the signal line and three rectangular conductive segments, and between each of the three rectangular conductive segments, and three rectangular conductive segments and the ground layer are generated.

The above summary of the present invention is not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

Figure 13:
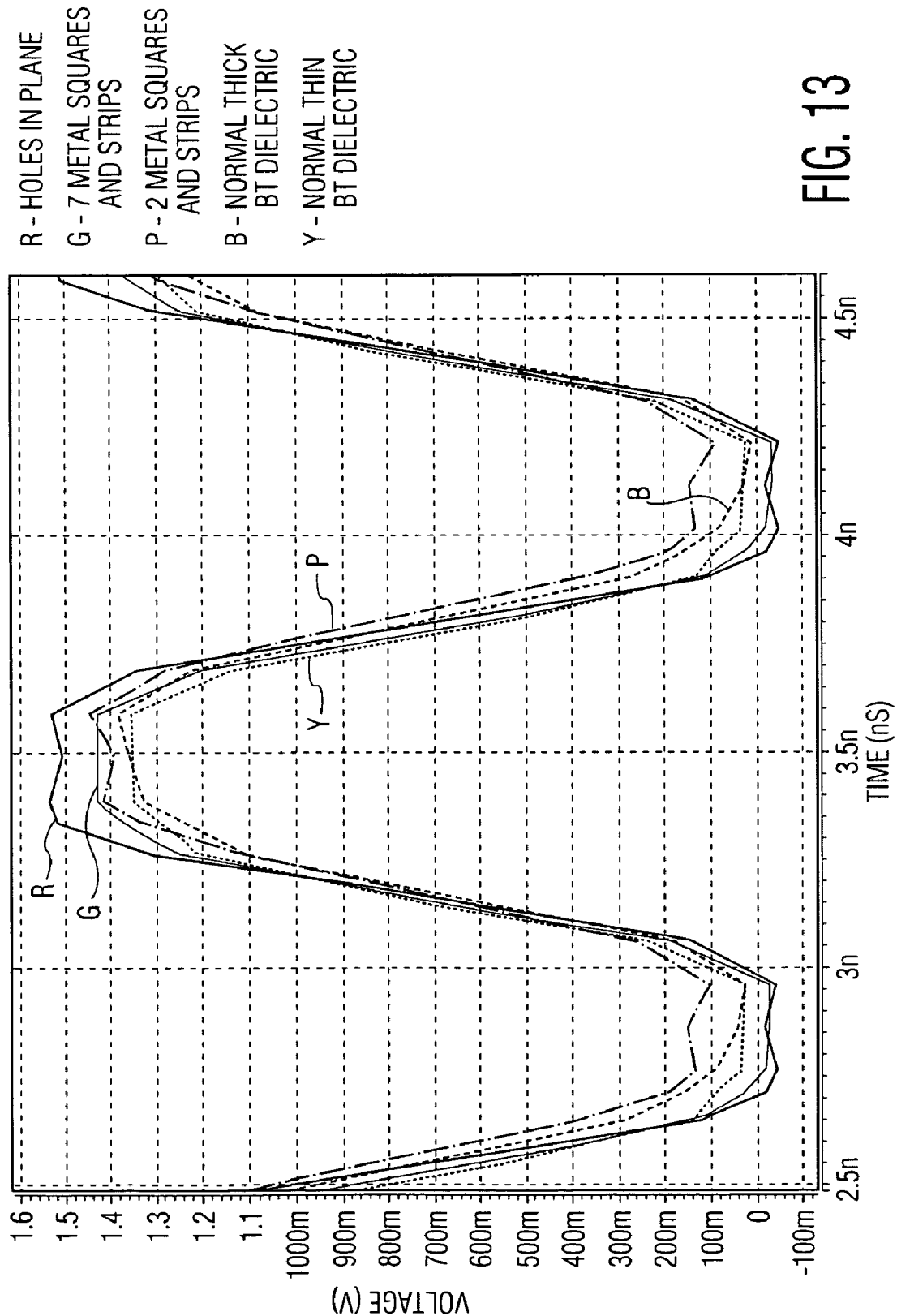
Figure 14A:
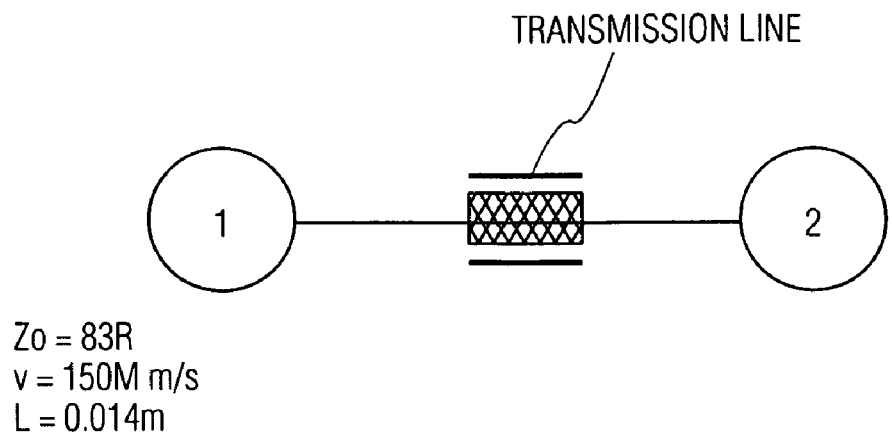
Figure 14B:
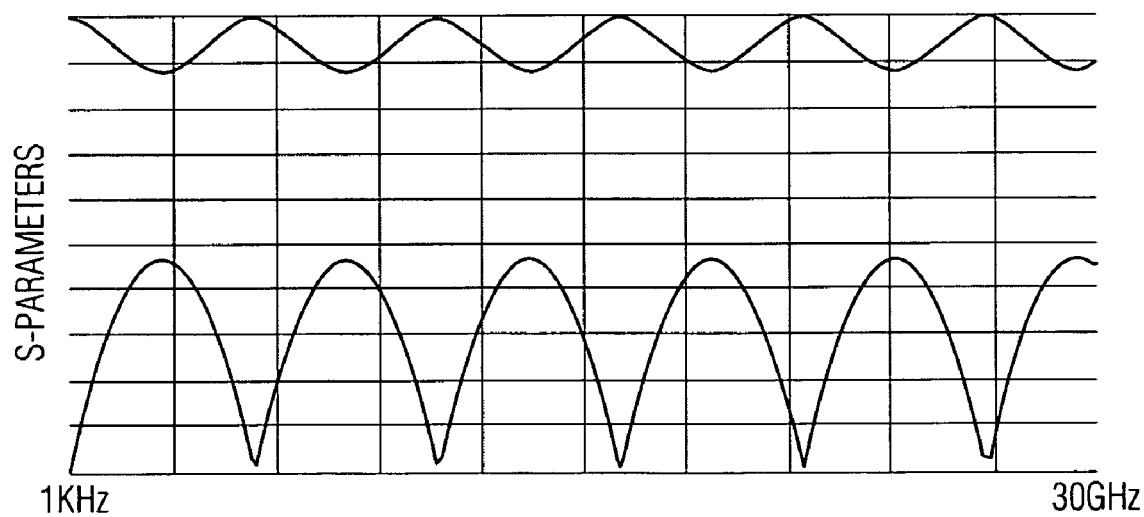
Figure 15A:
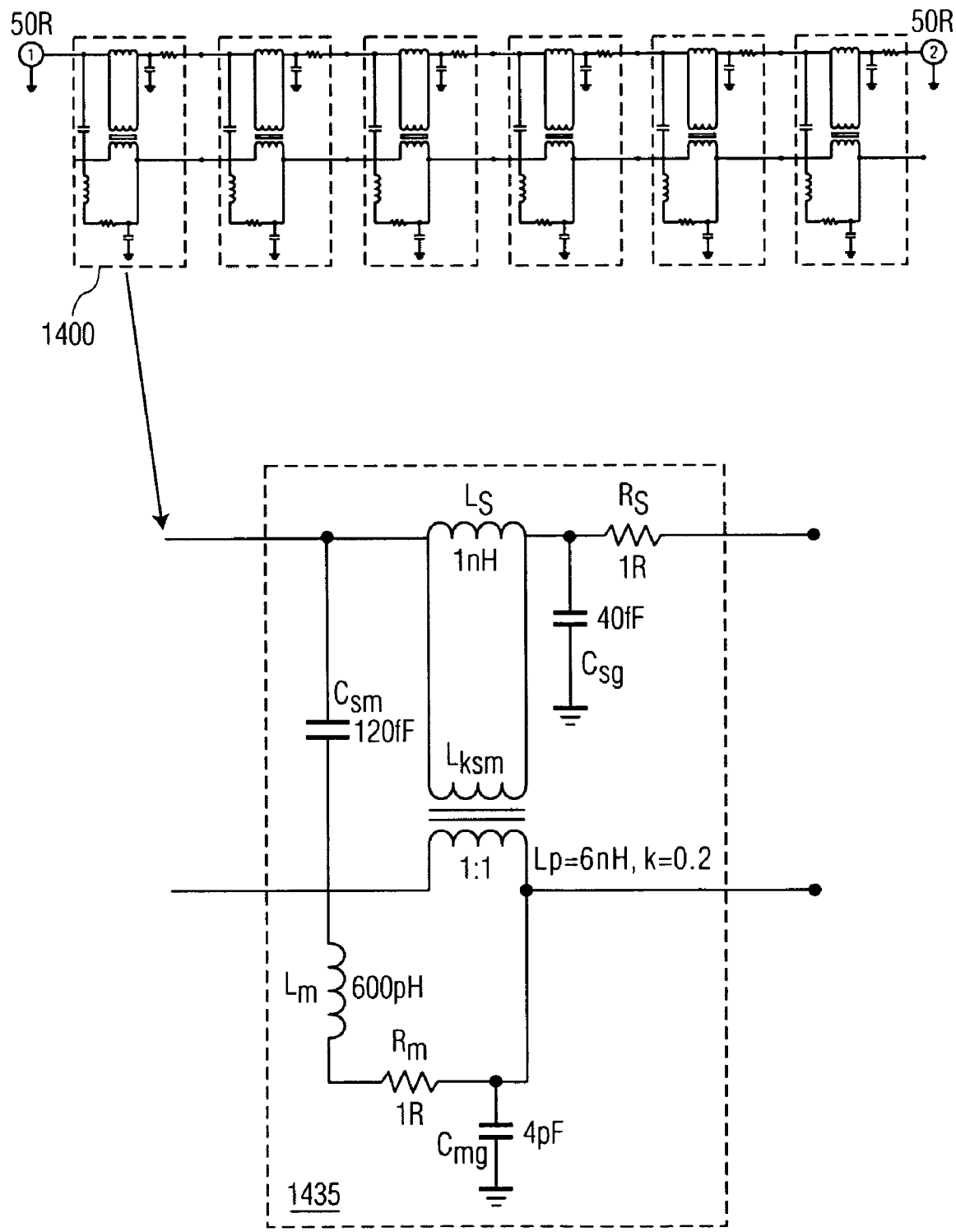
Figure 15B:
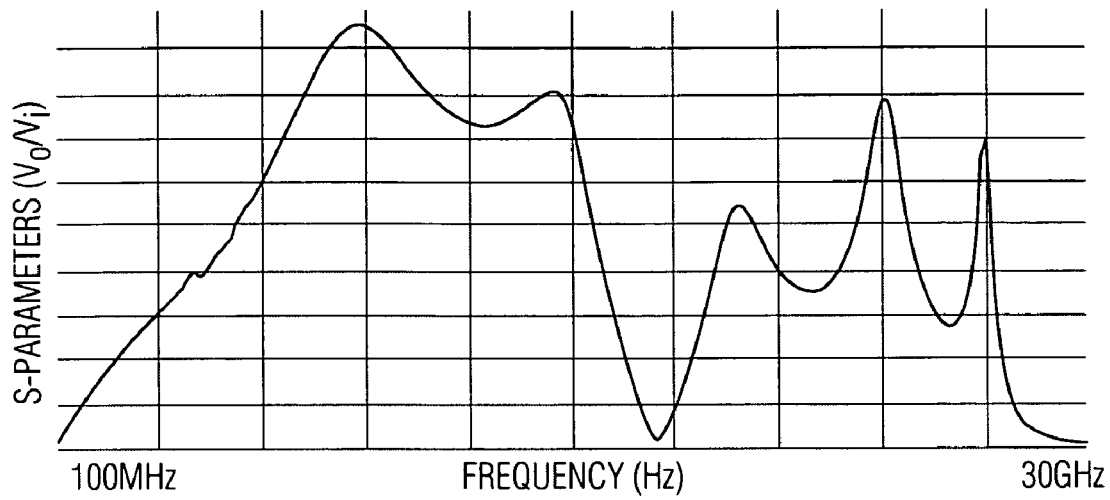
Figure 16:
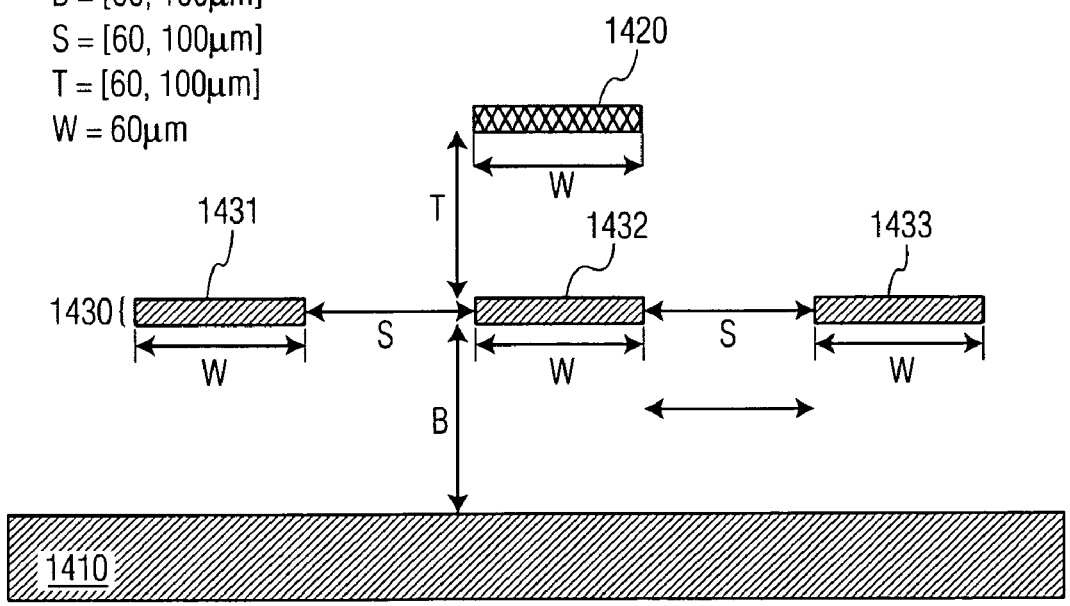
Figure 17:
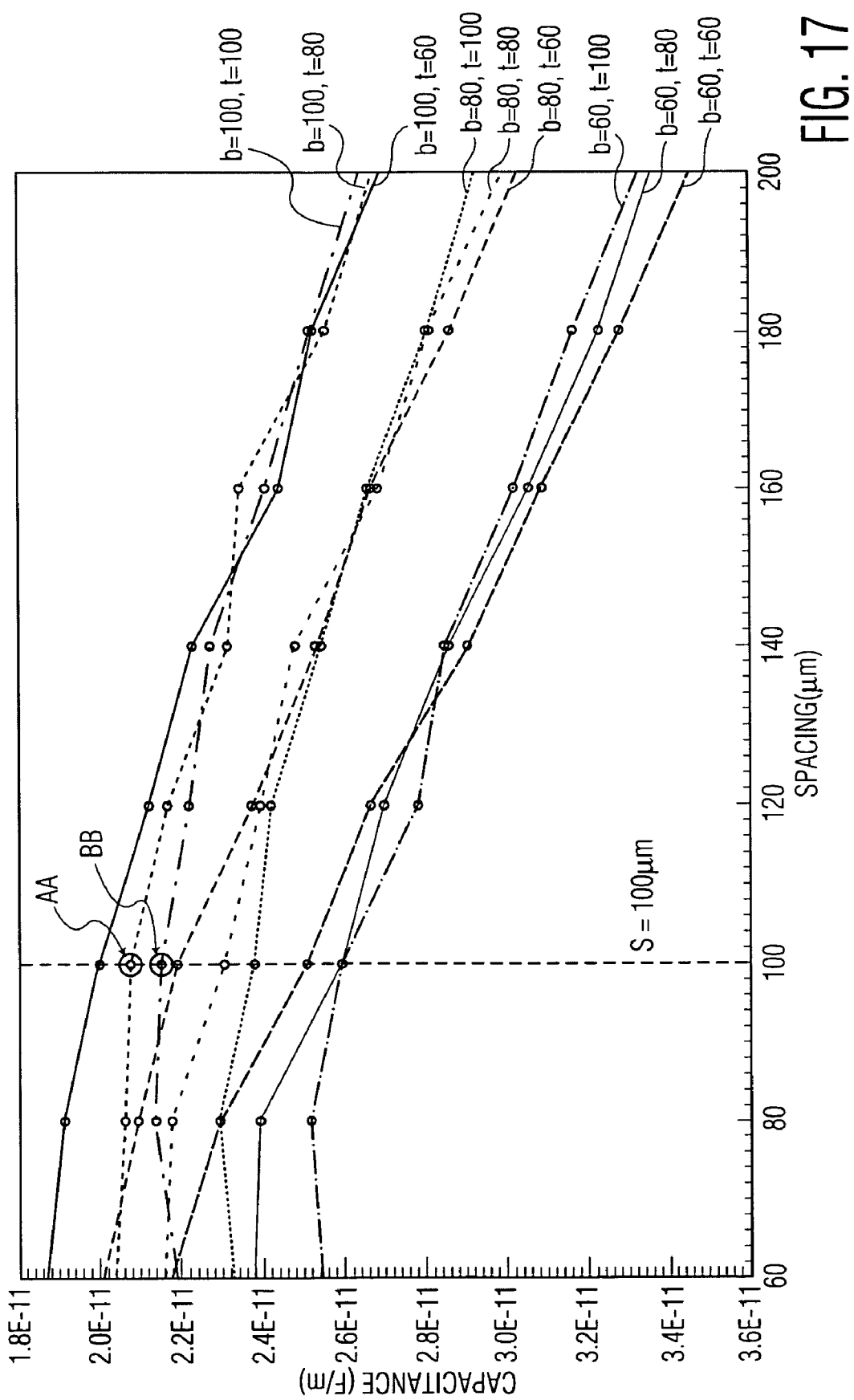
Figure 18:
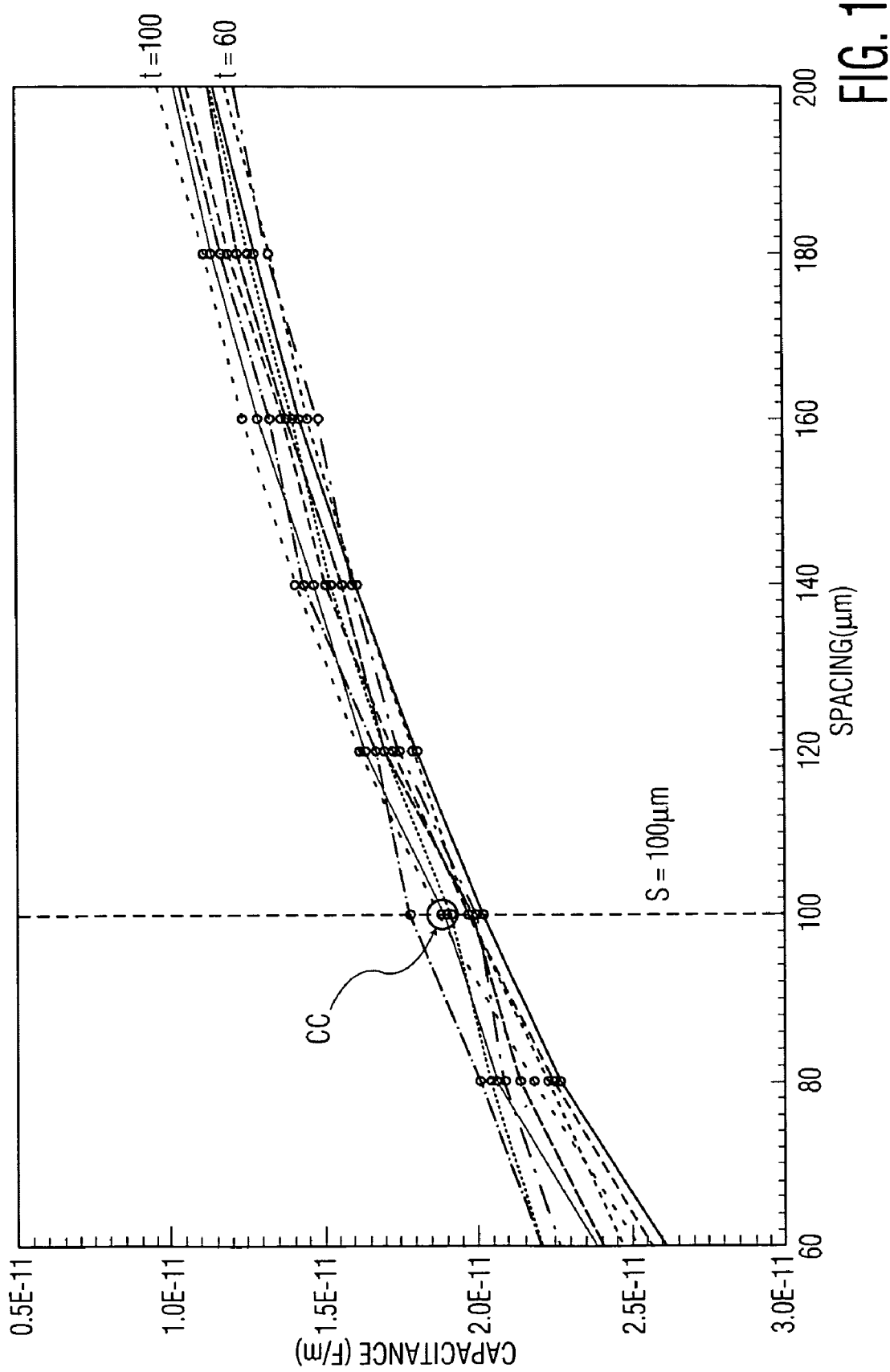
Figure 19:
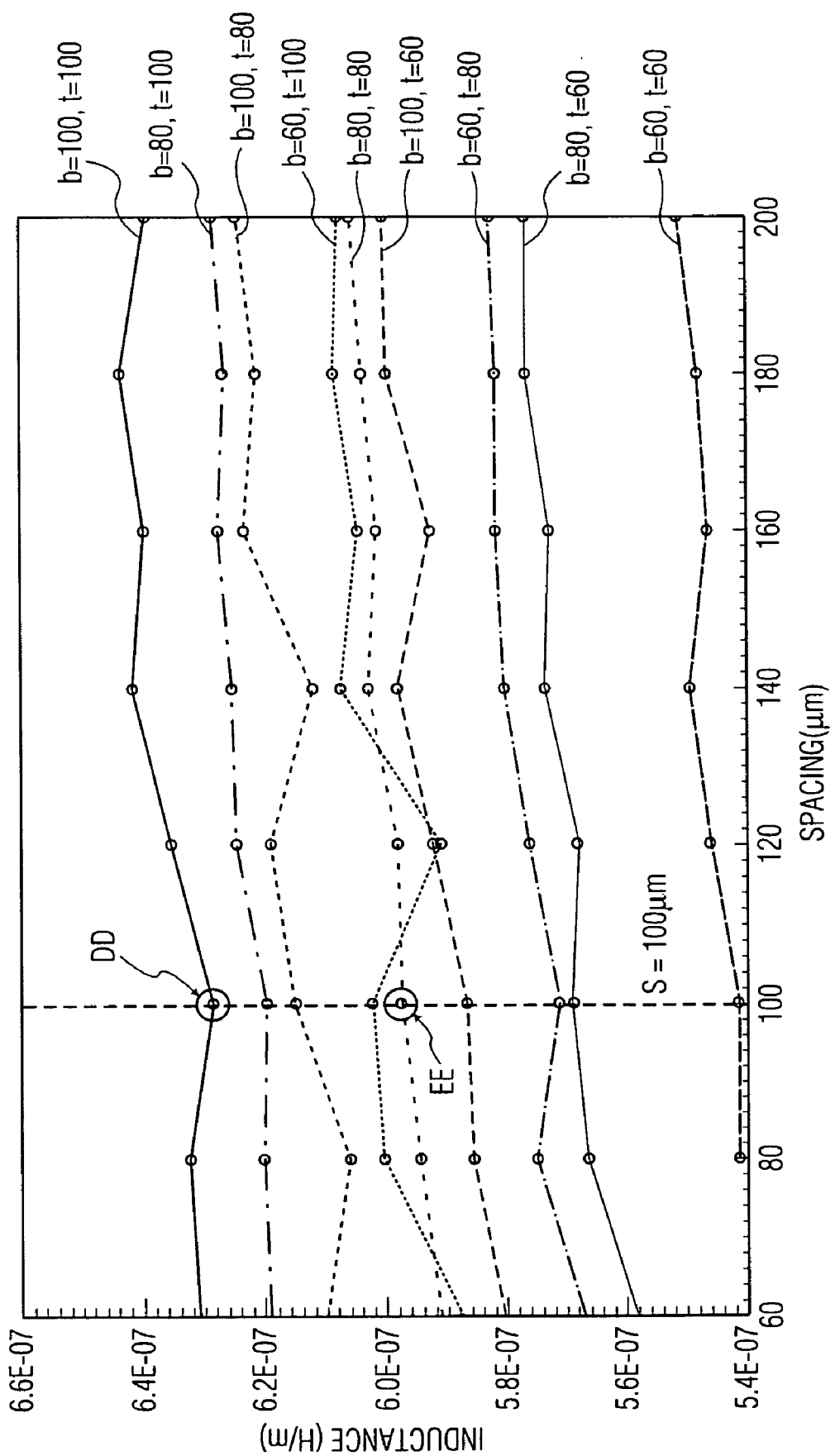
Figure 20:
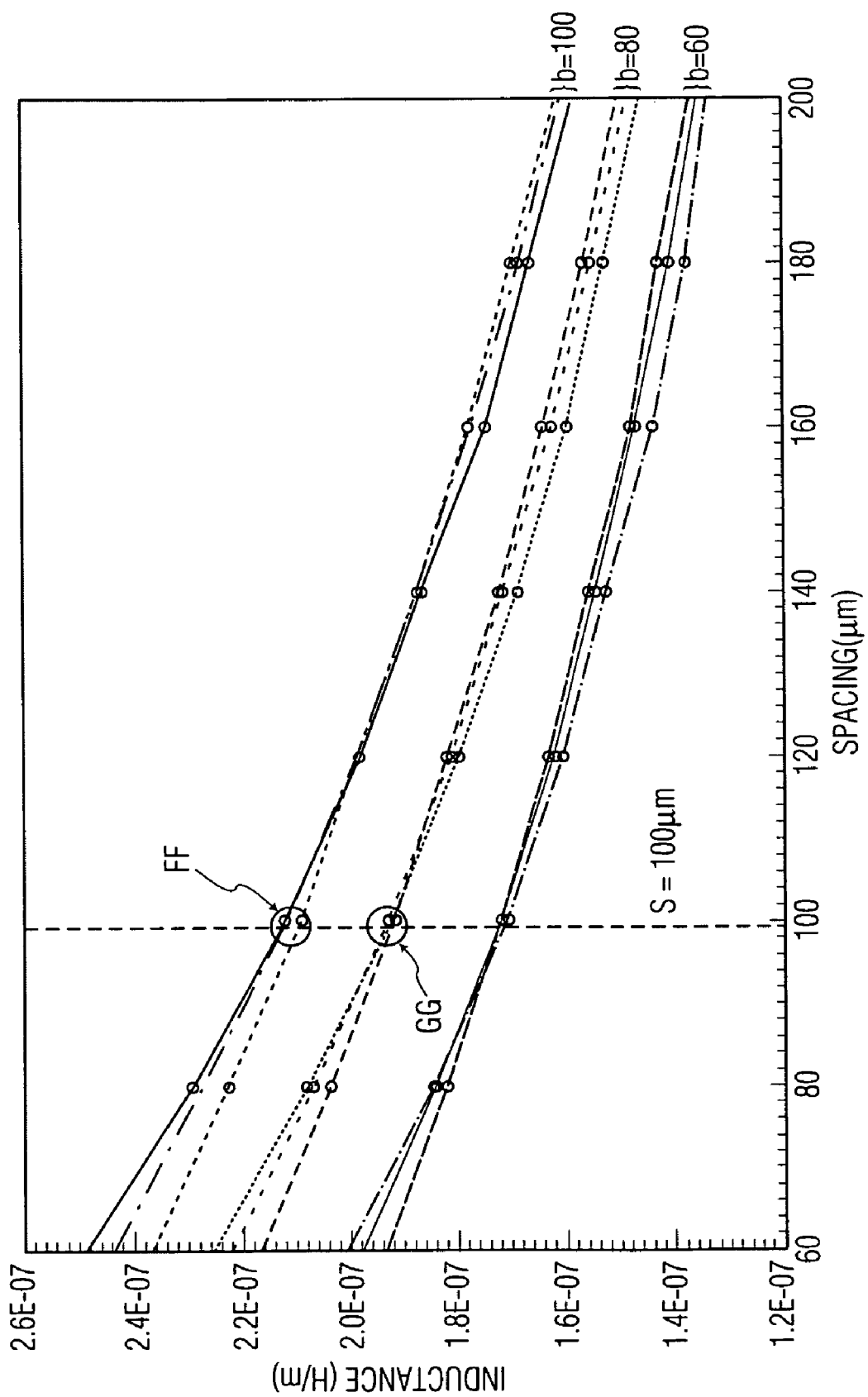
Figure 21:
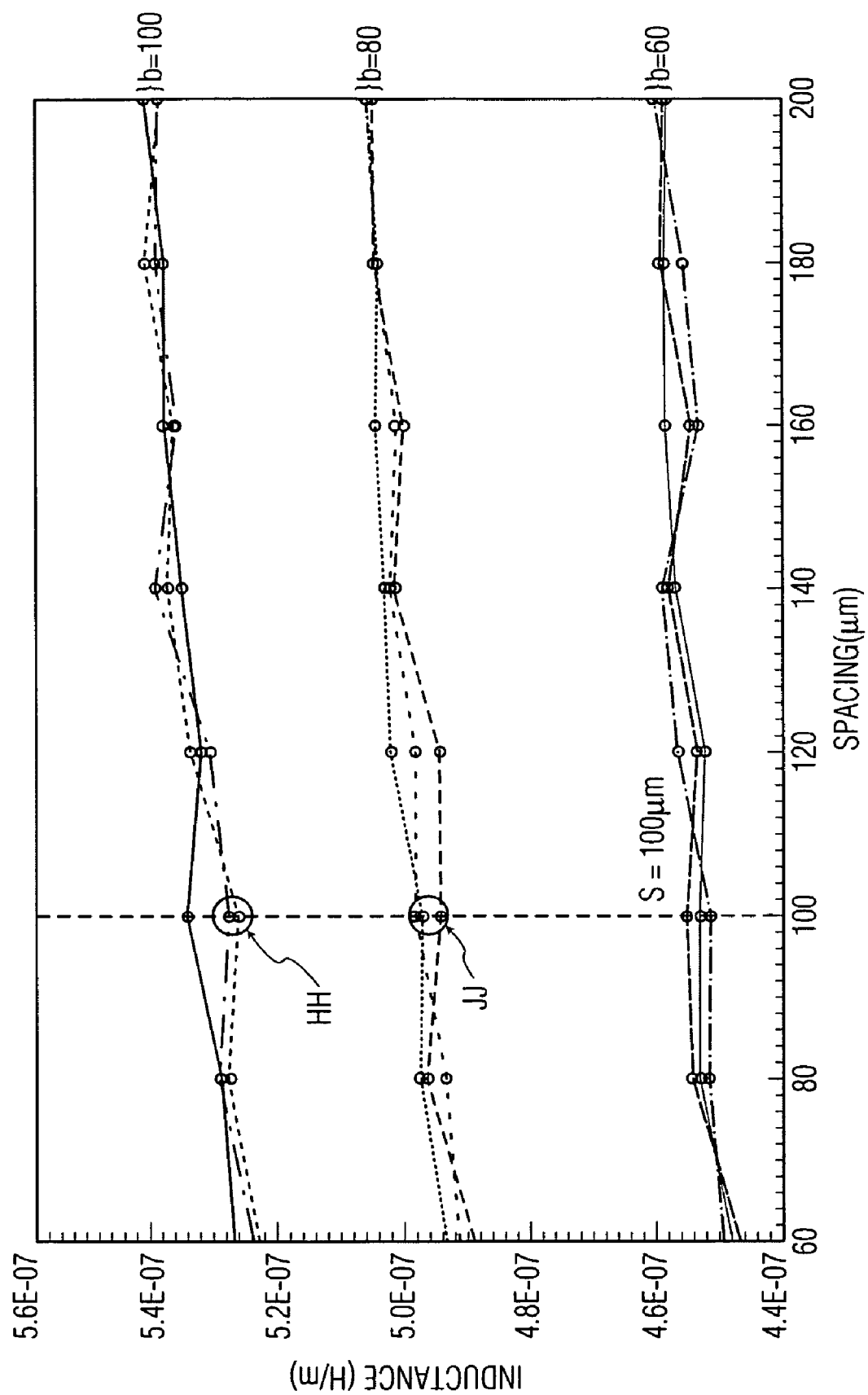
Figure 22:
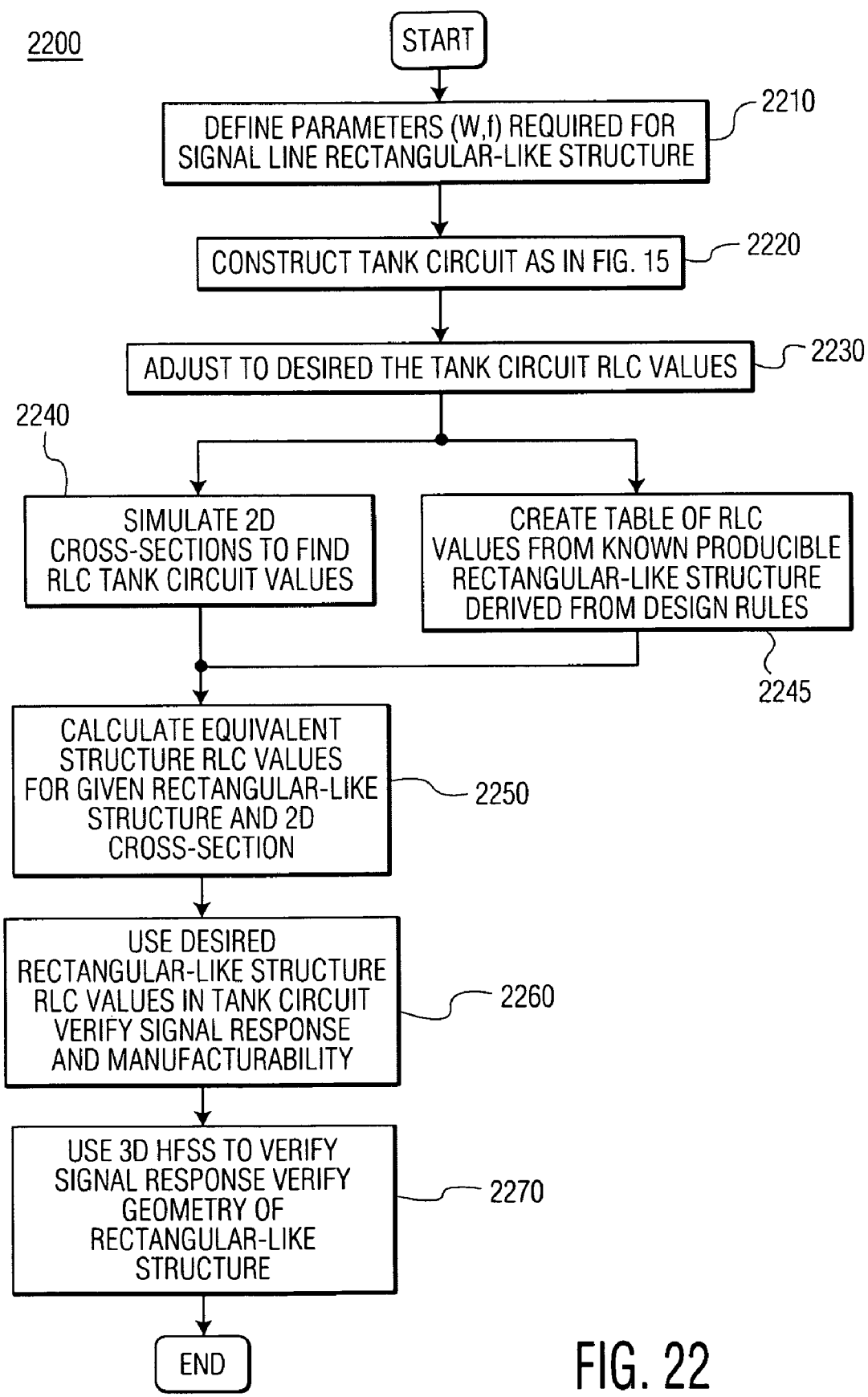
Figure 23:
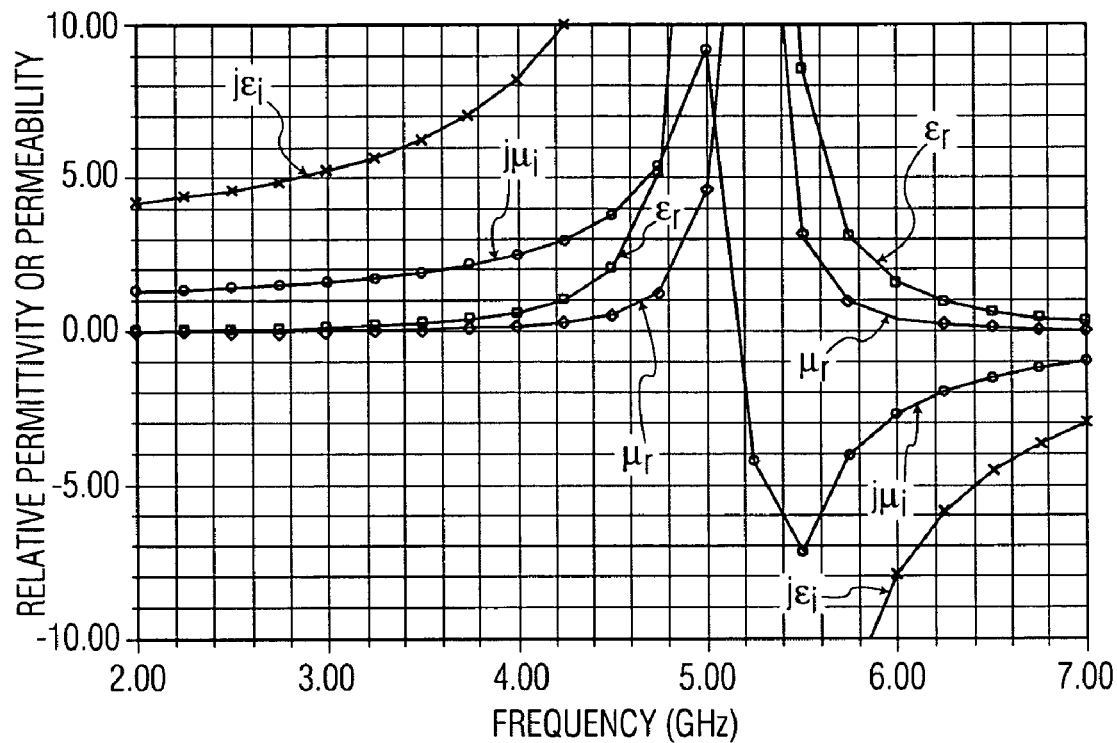
Figure 24:
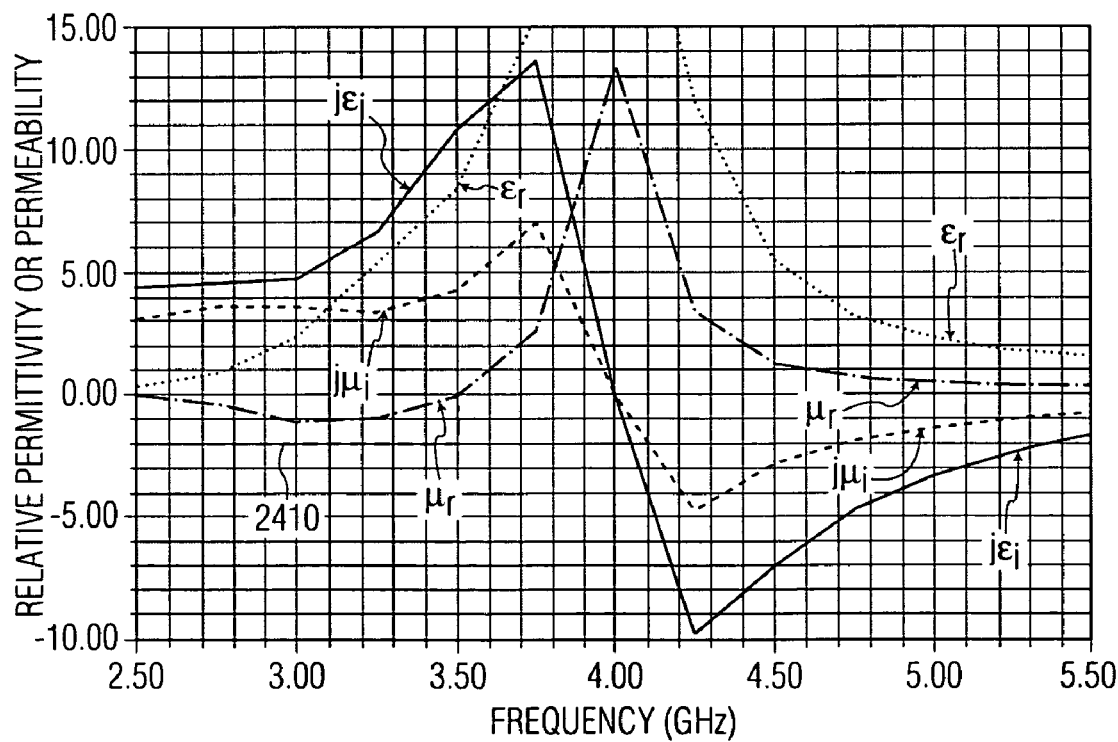

FIG. 13 of Output Voltage v. Time of a signal line on the metal material layout of FIG. 11 for five different embodiments;

FIG. 14A is a schematic representation (transmission line) of the signal line on an insulator substrate;

FIG. 14B is a plot of S-Parameters v. Frequency of the transmission line of FIG. 14A;

FIG. 15A is model of the meta-material geometry represented as a series of tank circuits;

FIG. 15B is a plot of the S-Parameters v. Frequency of the tank circuit array of FIG. 15A;

FIG. 16 is a two-dimensional cross-sectional structure used to estimate the electrical characteristics of the rectangular-like shape and its coupling to the transmission line;

FIG. 17 is a plot of Signal Line Capacitance to Ground ($C_{sg}$) v. Metallization Spacing (S) at various Metallization height (b) with respect to Ground Plane and Signal Line distance from Metallization;

FIG. 18 is a plot of Signal Line Capacitance to Metallization ($C_{sm}$) v. Spacing (S);

FIG. 19 is a plot of Signal Line Inductance ($L_s$) to Ground v. Spacing (S);

FIG. 20 is a plot of Signal Line Mutual Inductance to Metallization ($L_{ksm}$) V. Spacing; and FIG. 21 a plot of Metallization Inductance ($L_m$) v. Spacing (S); and FIG. 22 is a flowchart of an example process to obtain the dimensions of the two-dimensional model of meta-material according to FIG. 16;

FIG. 23 is a plot of the relative permeability ($\mu_R$) and relative permittivity ($\in_R$) v. Frequency for 14 mm Line on BT Substrate; and FIG. 24 is a plot of the relative permeability ($\mu_R$) and relative permittivity ($\in_R$) v. Frequency for 14 mm Line on Meta-Material.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

The present invention has been found to be useful reducing the noise associated with signal reflection at impedance boundaries. Through the use of meta-materials, such noise may be minimized. Meta-materials according to this invention are arrangements of conductors in an insulator to reduce the resonant response of a line as a signal propagates through it.

Figure 1:
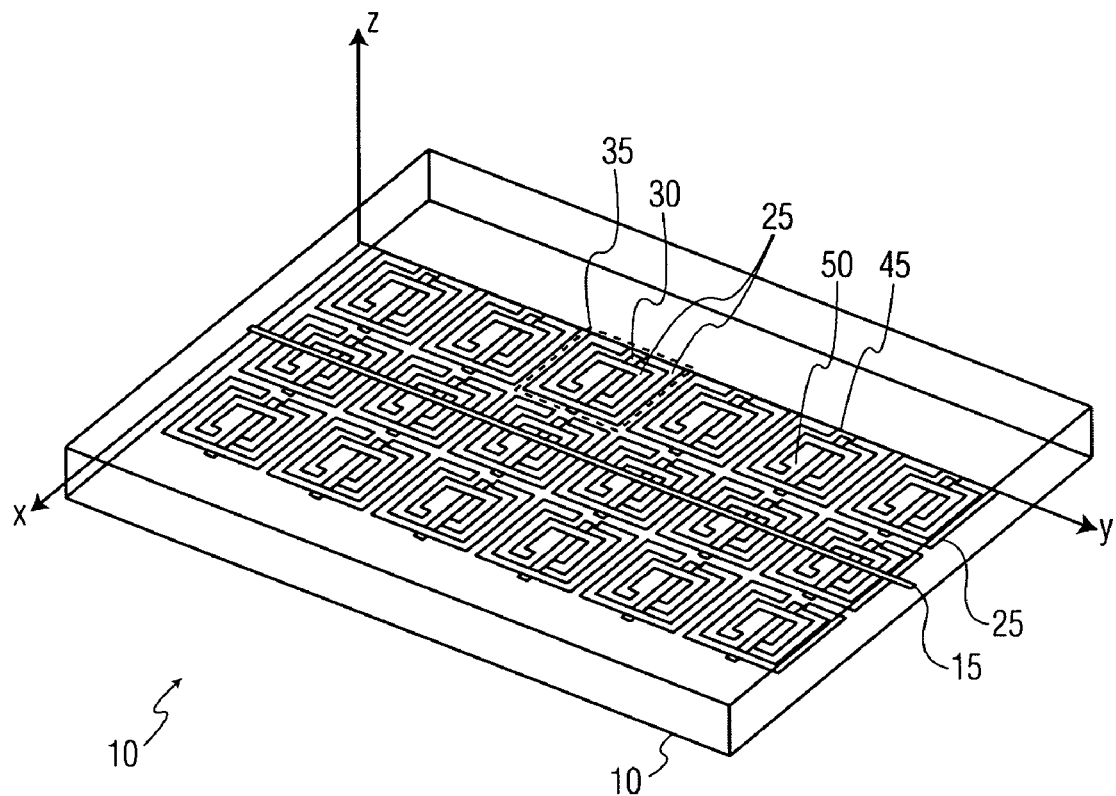
FIG. 1 is an isometric view of a meta-material substrate layout in accordance with an embodiment of the present invention.
Figure 2:
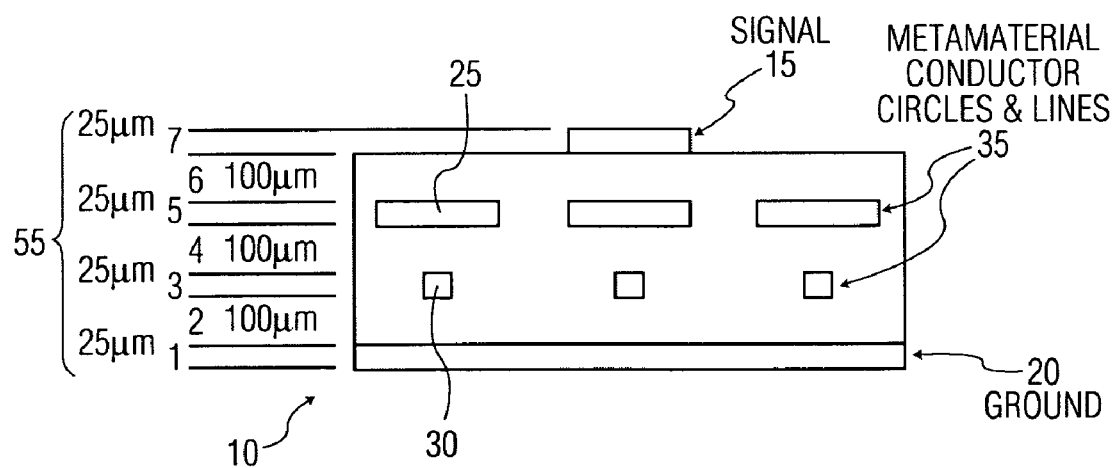
FIG. 2 is a cross-section view of FIG. 1.

In an example embodiment, there is an arrangement of open planar rectangular-like shapes s of conductive material and straight lengths of conductor to match the transmission line length. FIG. 1 and FIG. 2 illustrate the construction of a meta-material. Refer to FIG. 1. A substrate 10 has been configured as a meta-material. A pattern of conductive material 35 (i.e., a motif) is arranged as concentric "square-circles 25" (hereinafter, described as rectangular-like shapes, such shapes may include but are not limited to, rectangles, squares, etc.) and straight sections of metal 30. The signal line 15 is a 14 mm transmission line and the meta-material is designed to enhance the signal line's impedance to reduce signal noise. The sum of the lengths of the rectangular-like shapes 25 is comparable to (and often may match) the length of the signal line 15. The straight sections of metal 30 match the width of the rectangular-like shapes 25. The open rectangular-like shapes 25 in this embodiment are square in nature with a diameter of 2.5 mm, a conductor width of 0.1 mm and conductor height of 25 μm. The gaps 45, 50 in the rectangular-like shapes are 0.2 mm. The length of signal line 15 is 14 mm, the width is 0.1 mm and height is 25 μm. The insulator in this meta-material is bismaleiimide triazine (BT) resin.

Refer to FIG. 2. The substrate 10 may be constructed as multiple layers 55. Layer 1 is a ground plane 20 of 25 μm thickness. Upon the ground plane 20, layer 2 is insulating material of 100 μm thickness. Layer 3 is where the straight sections of metal 30 are defined and are 25 μm thickness. Layer 4 is another layer of insulating material of 100 μm thickness. Layer 5 includes the arrangement of concentric rectangular-like shapes 25 also 25 μm thickness. Upon layer 5 there is a layer 6 of insulating material of 100 μm thickness. Signal line 15 is defined on layer 7; signal line 15 has a thickness of 25 μm. Thus, for a given package substrate, such as used in a BGA package, the present invention may be implemented in four metal layers.

Figure 3:
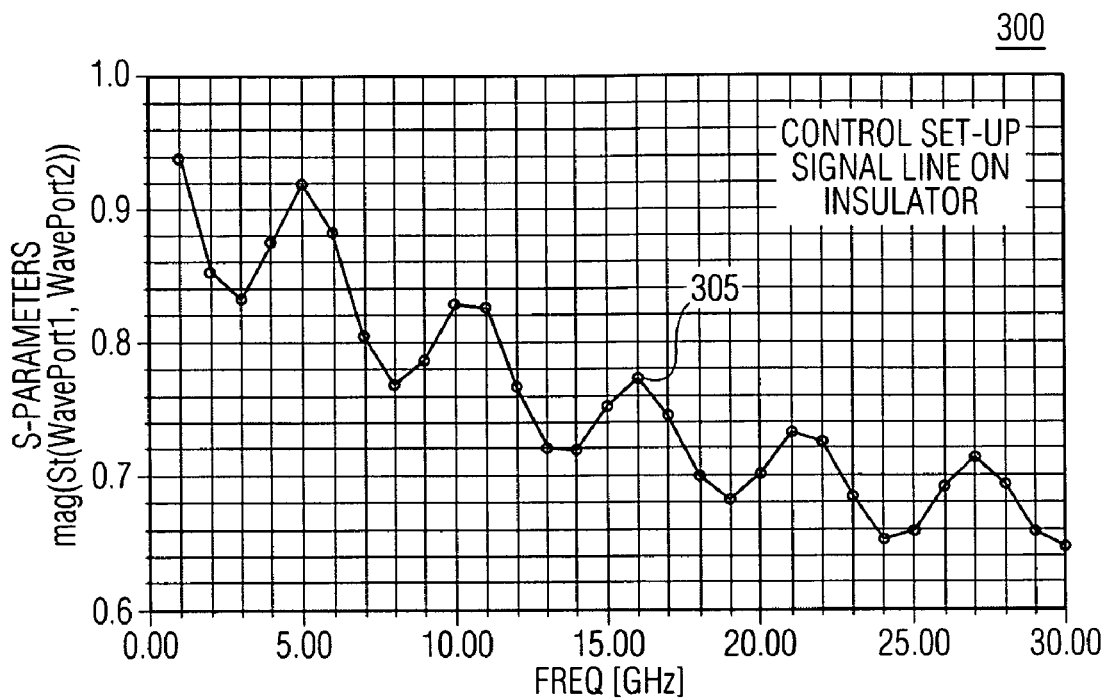
FIG. 3 is a plot of the magnitude of S-parameters v. Frequency for a signal line on an insulating substrate.

Refer to FIG. 3. For a 14 mm signal transmission line ($Z_o$=83 ohm) laid-out on BT resin insulator in the same manner as that for FIG. 1 but without metal rectangular-like shapes and strips. There is a plot 300 of the S-parameter v. frequency. A square-wave input signal is driven through the signal line. Curve 305 shows the ratio of output voltage to input voltage (e.g., the signal integrity) declining as frequency increases from 1 GHz to about 30 GHz. As the input frequency increases, the amplitude of the waveform decreases, indicating a reduction in output and reduction in transmission through the signal transmission line. The solution to an EM model-meshing algorithm is defined at 20 GHz (which is a 7.5 mm edge length) for ANSOFT proprietary software (authored by ANSOFT Corporation, Pittsburgh, Pa.) used in obtaining the data for the present invention.

Figure 4:
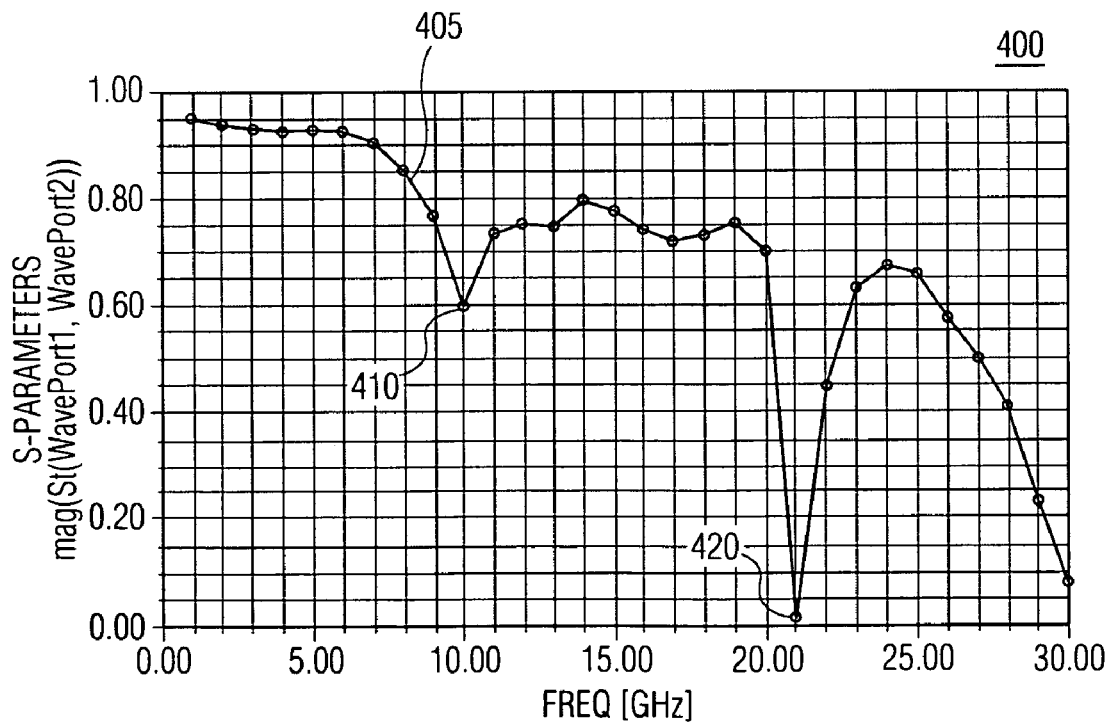
FIG. 4 is a plot of the magnitude of S-parameters v. Frequency for a signal line on the meta-material substrate of FIG. 1A.

Refer to FIG. 4. The structure depicted in FIG. 1 and FIG. 2 has its S-parameter simulated. A plot 400 of S-parameter v. frequency shows curve 405 having two minima 410, 420 at 10 GHz and 21 GHz, respectively. These two frequencies may be thought of as the resonant frequencies of the signal line on the meta-material. The 10 GHz and 21 GHz are first and second harmonic frequencies, respectively. Excepting these two frequencies, the downward trend of the $V_O/V_{IN}$ ratio of FIG. 3 is not present at other frequencies. The meta-material structure maintains the S-parameter (e.g., which is related to signal integrity) above 0.60 throughout the frequency range of 4 GHz to 25 GHz.

To gage the performance of a substrate configured as a meta-material with respect to a signal propagating through a metal line defined on the substrate, a test circuit is used. A goal of using the meta-material would be to match the impedance across the transmission line from the input to the output so that maximum power is transferred to the output and signal reflection within the line (at package interconnects) is minimized. From the S-parameters obtained from the plot of FIG. 4, it is possible in a test circuit to show an improvement in signal quality at a number of frequencies.

Figure 5:
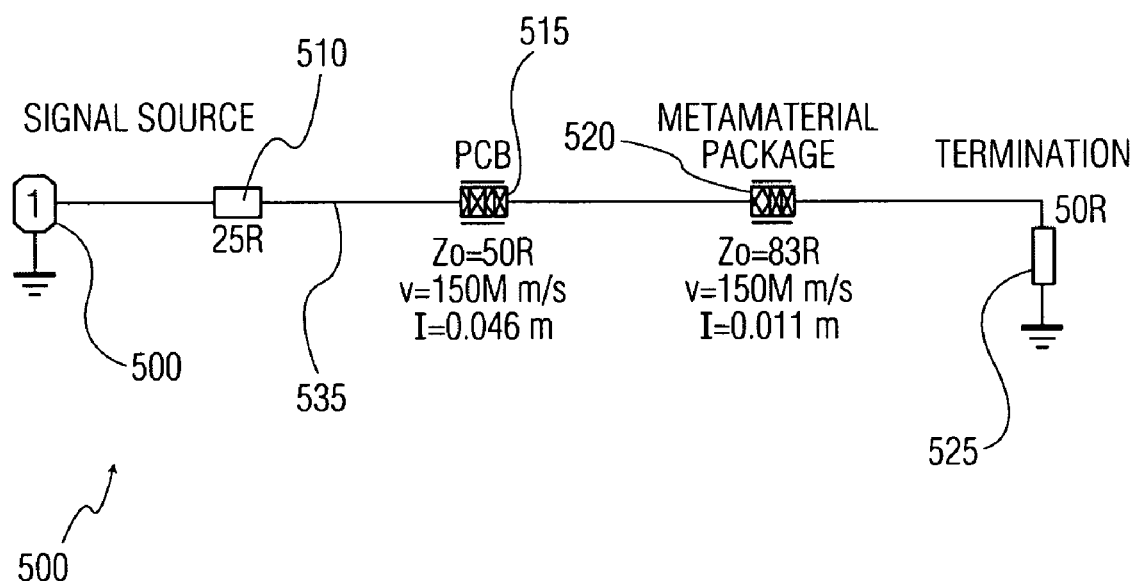
FIG. 5 is a schematic of a test circuit to measure the performance of a meta-material package.

Refer to FIG. 5. Test circuit 500 has a signal source 505 that provides a square-wave input to the transmission line. Coupled to the signal source 505 is load impedance 510 of about 25 ohms. Coupled to the load impedance 510 is PCB material 515 with a signal line having a characteristic impedance of 50 ohms ($Z_0$=50 ohms, υ=150M m/s, length=0.046 m). Coupled to the signal line in PCB material 515 is the signal line laid-out on the meta-material package 520. This signal line for the normal transmission line case (without meta-material) has a characteristic impedance of 83 ohms ($Z_0$=83 ohms, υ=150M m/s, length=0.011 m), the impedance and length of the meta-material line having been derived from the S-parameters simulated and depicted in FIGS. 3 and 4. A termination 525 of 50 ohms is coupled to the output of the meta-material package 520. The meta-material package 520 characteristics have been matched to those of the PCB 515 such that as the signal 505 propagates through, noise and reflection between the PCB 515 and meta-material package 520 are minimized.

Figure 6:
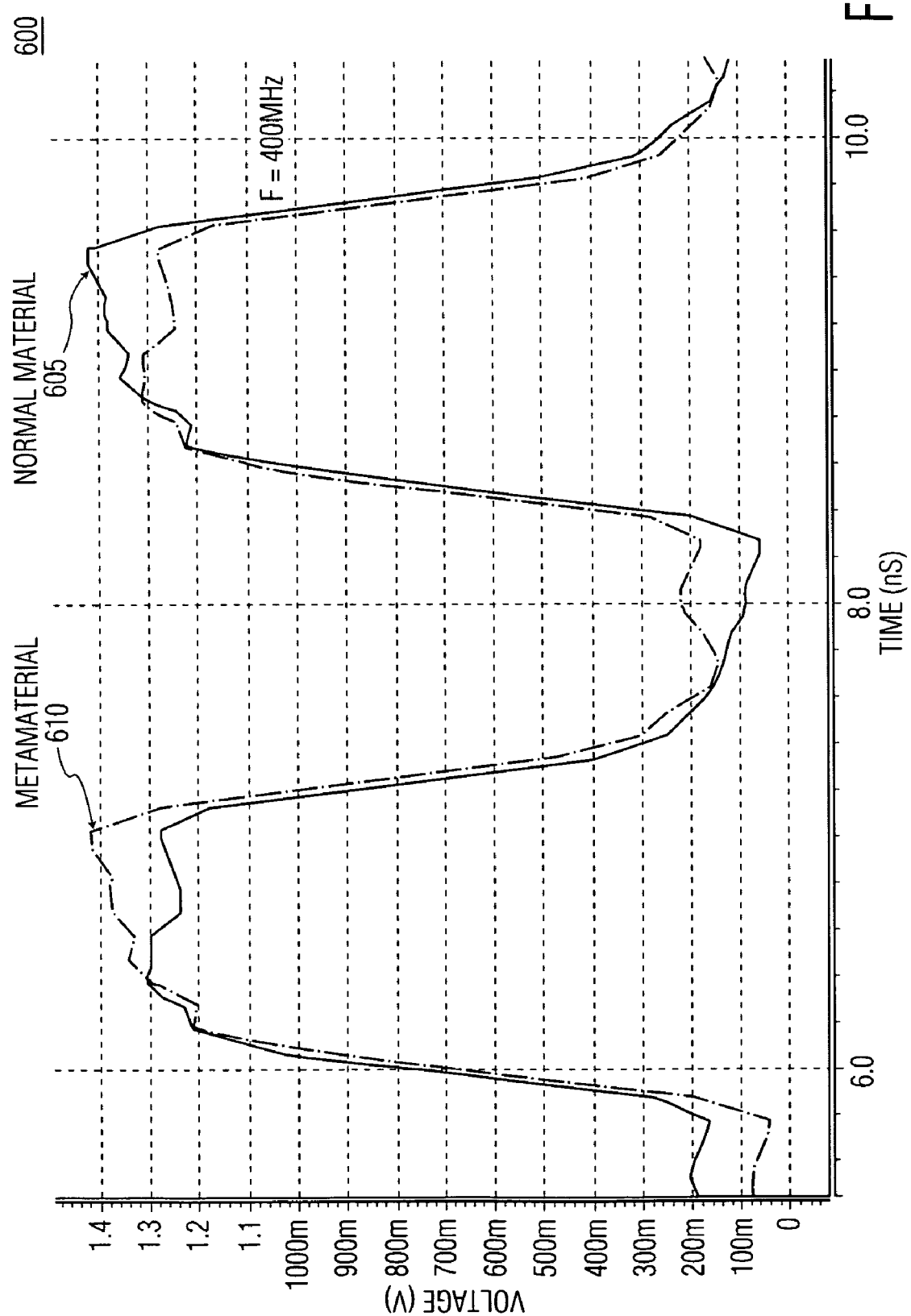
FIG. 6 is a plot of an Output Voltage v. Time of a signal line on meta-material and standard material at an signal frequency of 400 MHz.

Using the circuit as depicted in FIG. 5, the meta-material package 520 undergoes testing. Refer to FIG. 6. Plot 600 is $V_{out}$ v. Time. At an input frequency of 400 MHz, the output voltage 525 is measured for both normal BT resin material and meta-material with respect to time period. The input voltage is a square wave. Curve 605 shows the normal material and curve 610 shows the meta-material. There is a 100 mV improvement in the $V_{out}$ than that for the normal material.

Figure 7:
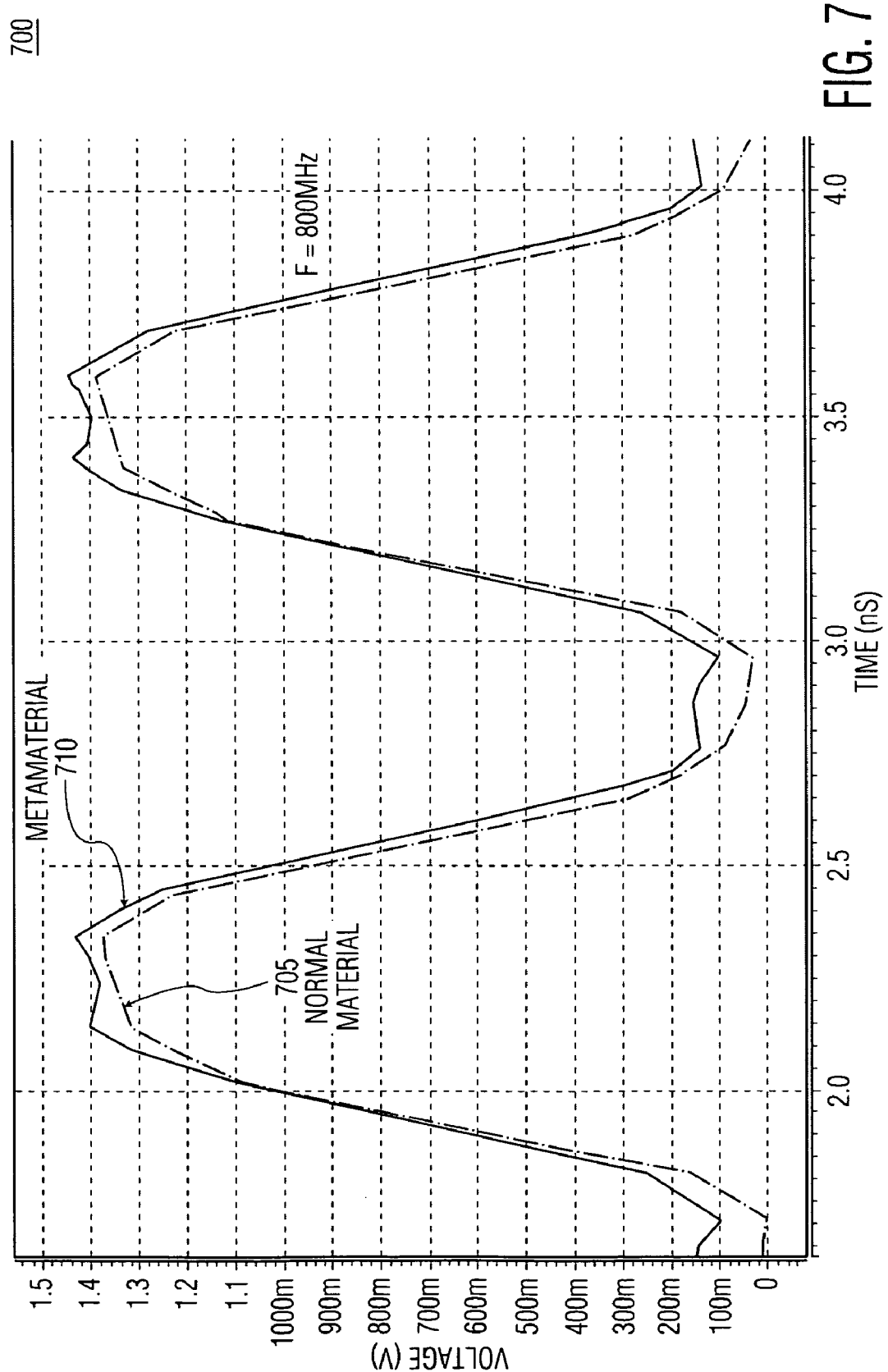
FIG. 7 is a plot of an Output Voltage v. Time of a signal line on meta-material and standard material at an signal frequency of 800 MHz.

Refer to FIG. 7. Plot 700 is $V_{out}$ v. Time. At an input frequency of 800 MHz, the output voltage 525 is measured for both normal BT resin material and meta-material with respect to time period. The input voltage is a square wave. Curve 705 shows the normal material and curve 710 shows the meta-material. Again, there is a 100 mV improvement in the $V_{out}$ than that for the normal material.

Figure 8:
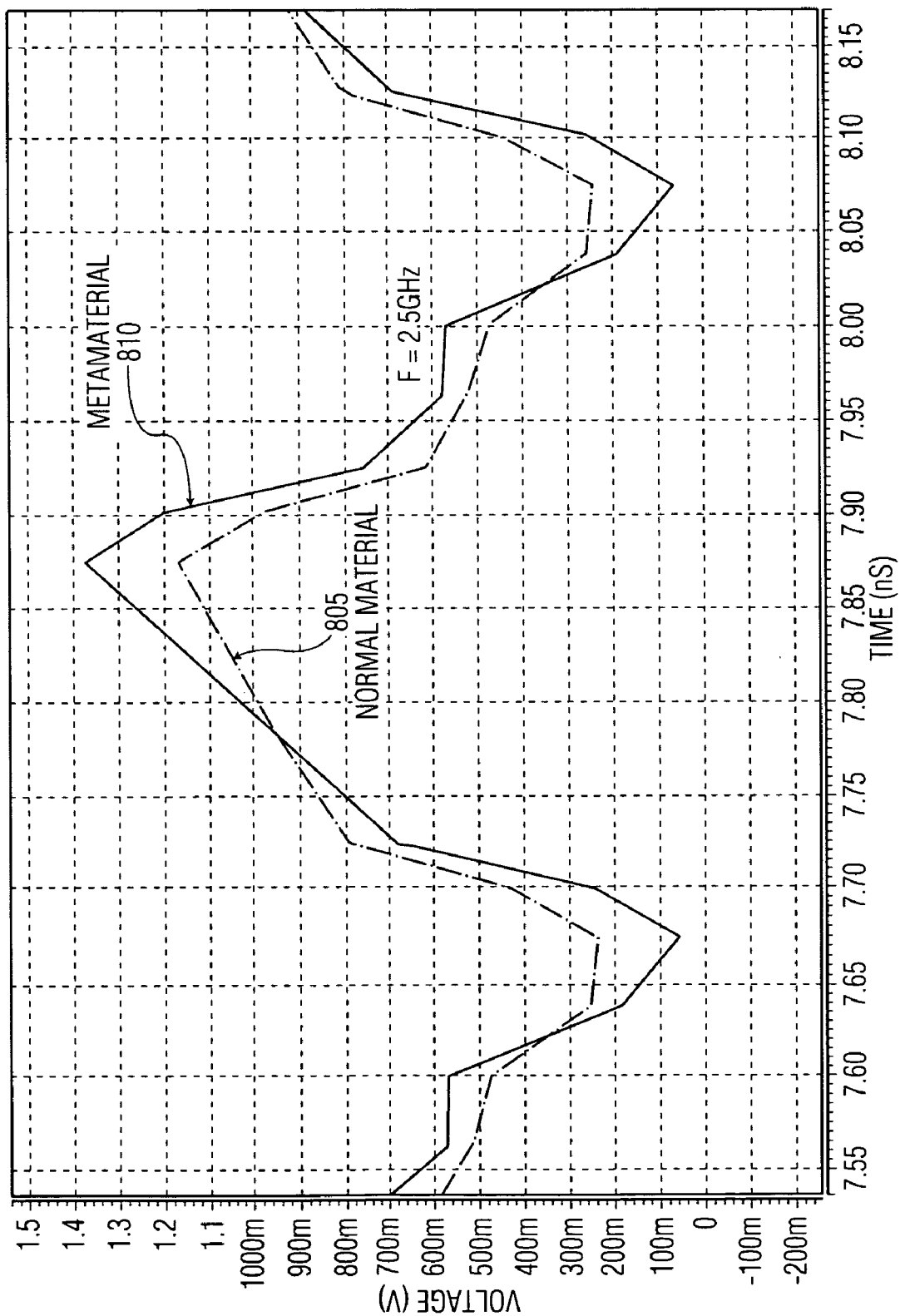
FIG. 8 is a plot of an Output Voltage v. Time of a signal line on meta-material and standard material at an signal frequency of 2.5 GHz.

Refer to FIG. 8. Plot 800 is $V_{out}$ v. Time. At an input frequency of 2.5 GHz, the output voltage 525 is measured for both normal BT resin material and meta-material with respect to time period. The input voltage is a square wave. Curve 805 shows the normal material and curve 810 shows the meta-material. There is about a 200 mV improvement in the $V_{out}$.

Figure 9:
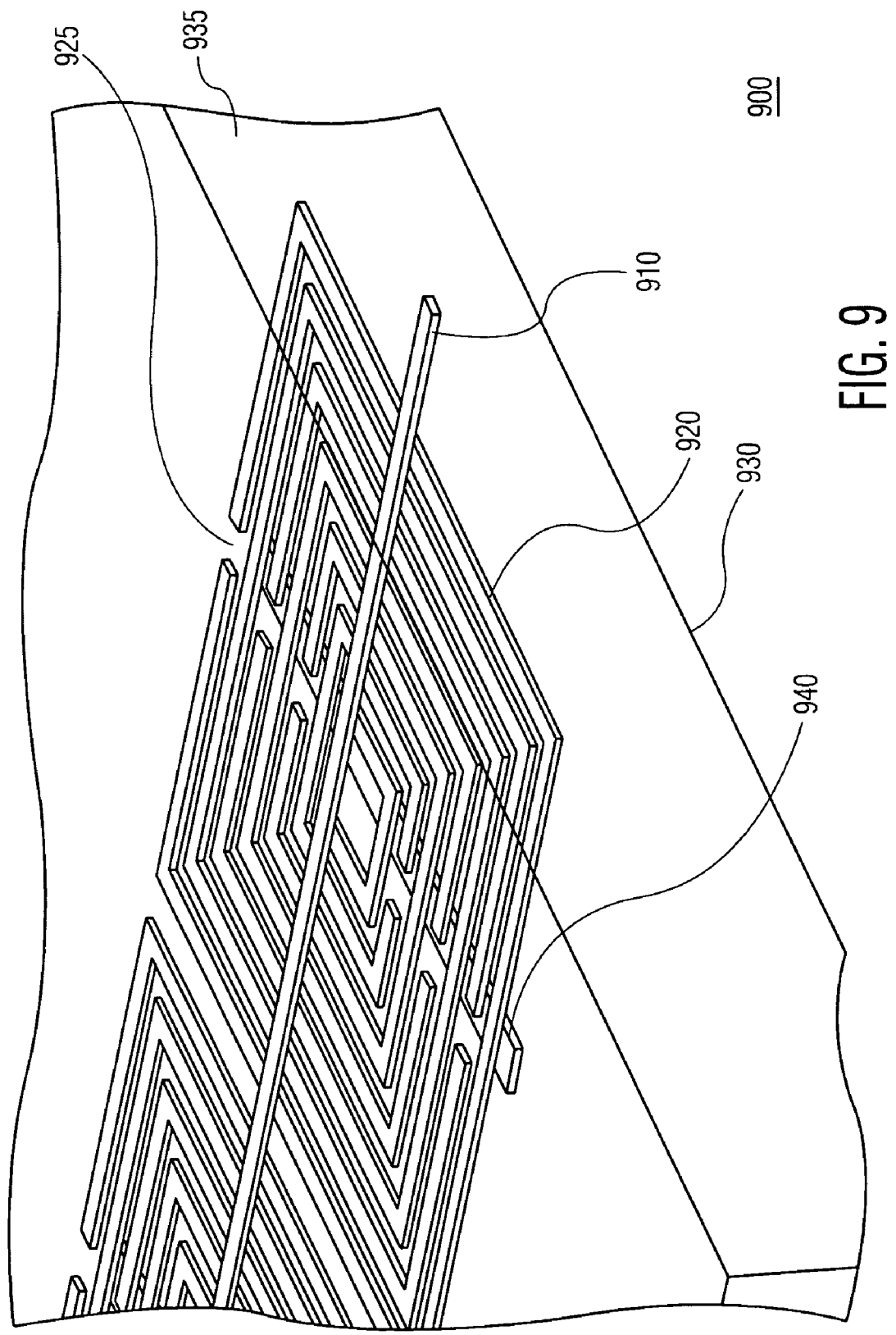
FIG. 9 is an of isometric view of a meta-material substrate layout, the layout having seven concentric squares and a strip line in accordance with another embodiment of the present invention.
Figure 10:
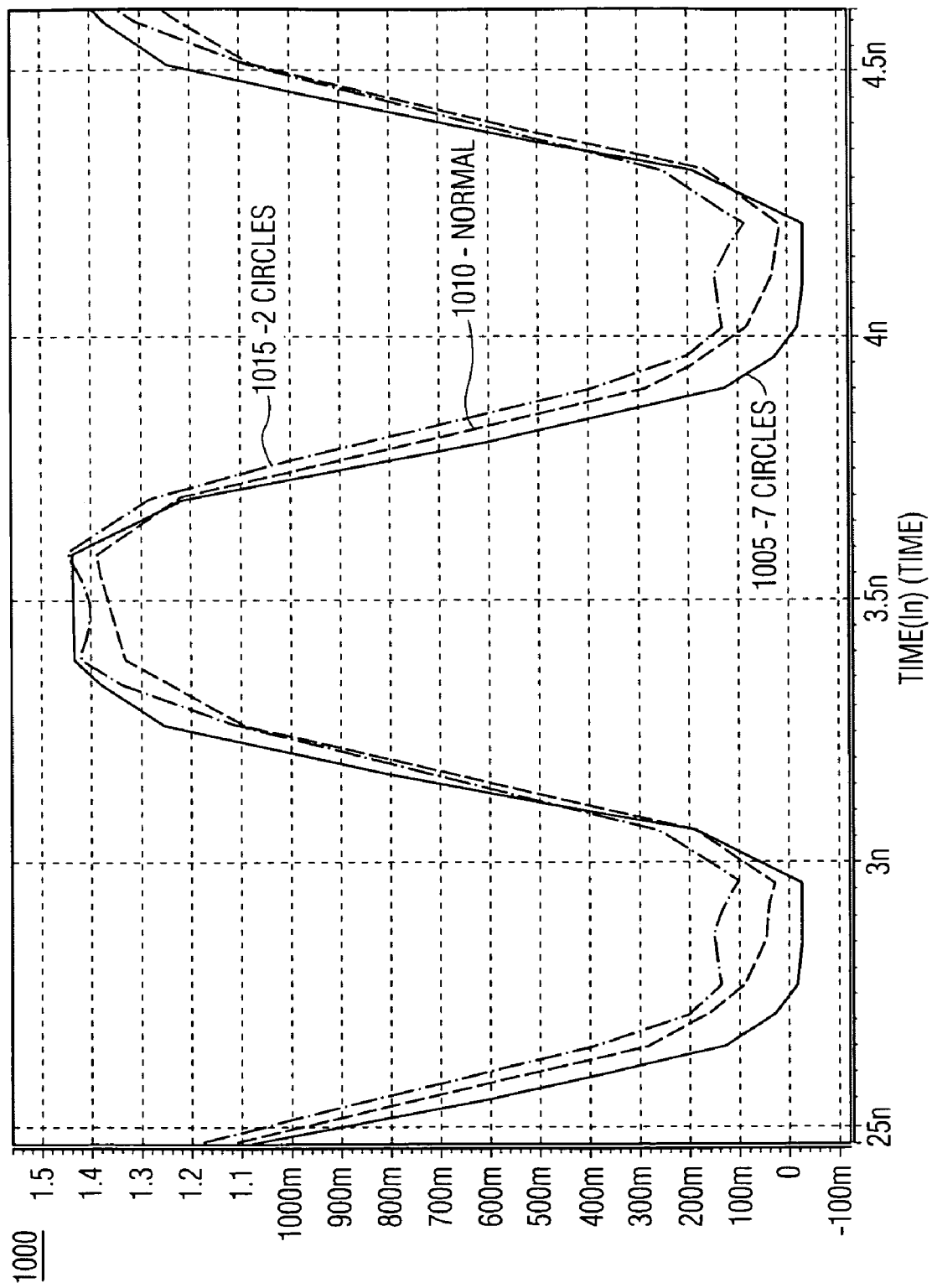
FIG. 10 is a plot of Output Voltage v. Time of a signal line on meta-material as arranged in FIG. 9.

In another example embodiment, a meta-material is constructed in a similar pattern as that of FIG. 1 and FIG. 2. However, there are additional concentric squares. Refer to FIG. 9. A substrate 900 has a signal strip 910 on an insulated substrate 935. Underneath the signal strip 910 are seven conductive concentric squares 920. Each square has an opening 925 about the center of a given side. The squares are arranged so that openings are not present on adjacent squares. Underneath the seven concentric squares 920, separated by insulated substrate at a pre-determined distance a straight line strip of metal 940 runs below the areas defined by the openings 925 and is oriented in a direction traversing the signal strip 910. The meta-material is disposed above a ground plane 930. In a high frequency structure simulation (HFSS), the layout of FIG. 9 is analyzed in the test circuit of FIG. 5. Refer to FIG. 10. A plot 1000 of Output Voltage v. Time for the two embodiments and normal material. Curve 1005 is 2-square substrate. Curve 1010 is a normal substrate. Curve 1015 is 7-square material.

Figure 11:
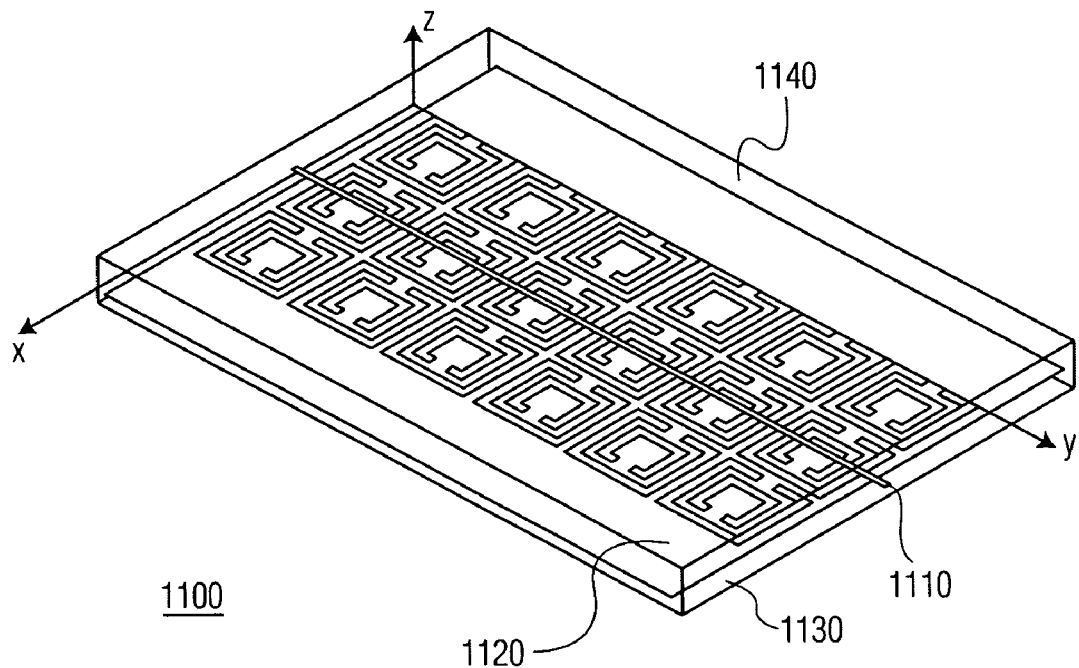
FIG. 11 is an isometric view of a meta-material layout having a metal layer with concentric rectangular-like areas absent of metal and no strip line in accordance with another embodiment of the present invention.

In another example embodiment, the meta-material is built with a floating metal in which a pattern of concentric squares has been defined. The strips underlying the concentric squares are not present. Refer to FIG. 11. A meta-material substrate 1100 has a signal line 1110 on insulating material. At a predetermined distance below the signal line, a floating metal 1120 having concentric squares is defined. In contrast, with the previous embodiments, the squares are regions with an absence of metal. At another predetermined distance from the floating metal 1120 is a ground plane 1130. Such a metal substrate may be constructed in multiple layers as discussed in reference to FIG. 2.

Figure 12:
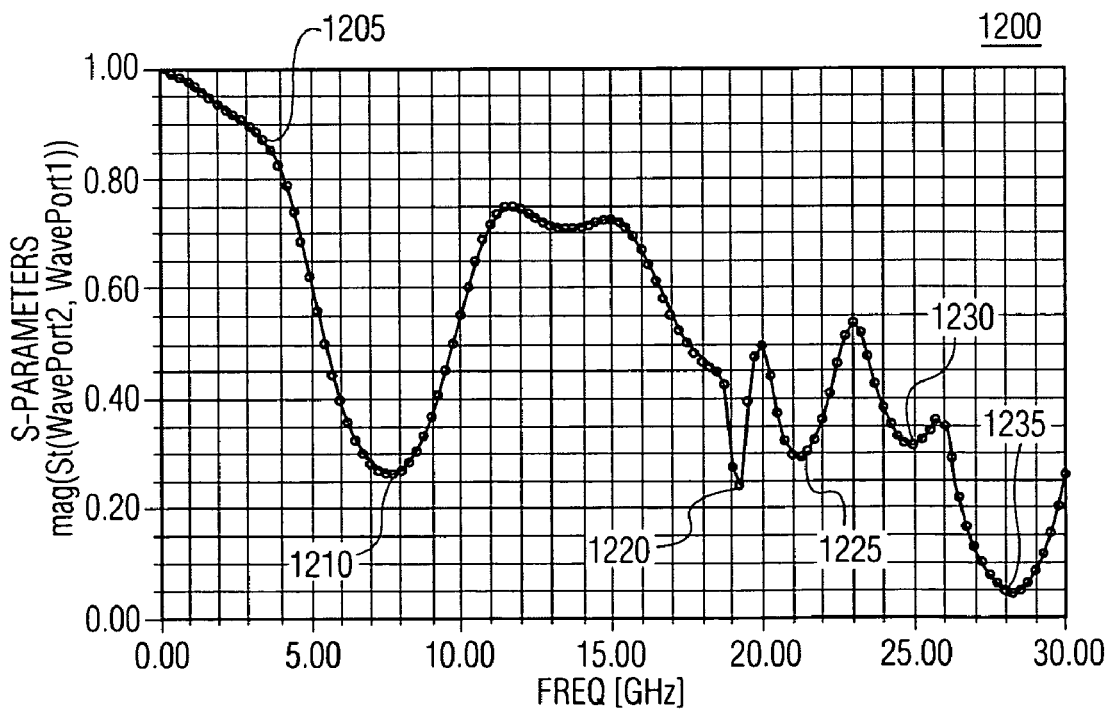
FIG. 12 is an S-parameter v. Frequency plot of the signal line on the meta-material layout of FIG. 11.

The S-parameters may be plotted for the structure of FIG. 11. Refer to FIG. 12. A plot 1200 of S-parameters v. Frequency is depicted. Curve 1205 of has a number of minima. There are minima at 7.5 GHz, 19 GHz, 21 GHz, 25 GHz, and 28 GHz, as denoted by 1210, 1220, 1225, 1230, and 1235, respectively. These minima represent resonant frequencies and their harmonics. Having determined the S-parameters, the meta-material substrate is tested in the setup of FIG. 5.

The $V_{out}$ v. Time waveforms are depicted in FIG. 13 for five structures discussed supra. The improvement in $V_{out}$ transmission is depicted in the region 1310. Curve R depicts the results for the meta-material defined as a metal plane with square patterns within the BT material as depicted in FIG. 11. Curve G depicts the 7-metal squares and strips of FIG. 9. Curve P depicts the 2-metal square and strips of FIG. 1. Curve B depicts the transmission line on normal thick BT dielectric. Curve Y depicts the transmission line on normal thin BT dielectric.

The particular meta-material structure is determined in a given application. For example, a number of parameters, for example, are taken into account. These parameters may include, but are not limited to, 1). Length, width, thickness of signal line; 2) Number of concentric rectangular-like shapes, their dimensions; 3) the length, width thickness of straight strip line; 4) frequency range of operation; 4) distance of concentric rectangular-like from signal line 5) distance of straight strip line from concentric rectangular-like shapes, etc.

For a given application at a frequency of operation and line length, a number of methods for determining the desired configuration of rectangular-like shapes according to the present invention may be used.

To provide extremely accurate results would be to simulate the entire three-dimensional configuration of the meta-material structure (e.g., the structures of FIG. 1, FIG. 9, or FIG. 11) and the effects on the signal transmission line. One method takes into account the operating frequency and physical size of the transmission line. From that information the designer would simulate a number of three-dimensional EM models to arrive the optimal S parameter response for the application. One would vary the geometry of the rectangular-like shapes, their relative placement and their distance from the transmission line and the reference voltage plane. However, the resources and time needed to complete such a task may prove not cost-effective relative to the accuracy attained.

One method to aid in the optimization of the meta-material geometry is to think of the physical situation as a transmission line coupled to a number of tank circuits. (Refer to FIGS. 14A and 15A). Referring back to FIG. 1. The structure 10 may be modeled as a series 1400 of coupled tank circuits 1435. Each tank circuit represents the conductive line 15 crossing over one of the six motifs 35 of meta-material. The S-Parameters of transmission line in FIG. 14A is depicted in FIG. 14B. Likewise the S-Parameters of FIG. 15A of the series 1400 of tank circuits 1435 is plotted in FIG. 15B. By adjusting the electrical characteristics of the tank circuits one can achieve the desired response of the signal transmission line.

In the method, sufficient information may be obtained though it may lack the precision of three-dimensional configuration. Two-dimensional cross-sections of the rectangular-like geometry may be used estimate the electrical characteristics of the rectangular-like shapes and their coupling to the signal transmission line. Refer to FIG. 16. For a 60 µm metal line wide metal signal line, the results of two dimensional simulations under varying spacing of the rectangular-like segments and their distance from the signal line and voltage reference plane (commonly defined as ground, at 0v) are depicted in FIG. 17 through FIG. 21.

The system and software used to simulate the FIG. 16 structure and resulting plots of FIGS. 17-21 is an ANSOFT 2D Extractor (two-dimensional EM simulator).

In FIG. 16, a two-dimensional structure is simulated. Metallization 1430 having three conductive strips (1431, 1432, 1433) is separated at a vertical distance B from a voltage reference plane 1410. The three conductive strips 1431, 1432, and 1432 are separated at a horizontal distance s from one another. A signal line 1420 is separated a vertical distance T from the metallization 1430. The signal line 1420 and three conductive strips 1431, 1432, and 1433 are at a fixed width W. In an example embodiment, the dimensions B, S, and T range from about 60 µm to about 100 µm. The width w of the signal line and the three conductive strips (1431, 1432, 1433) is fixed at about 60 µm. The tank circuit 1435 of FIG. 15A depicts a circuit model of the two-dimensional structure of FIG. 16.

Thus, for a given signal transmission line, in the coupled tank circuits one can refer to the plots of the signal line inductance ($L_s$), signal line capacitance to metallization ($C_{sm}$), signal line capacitance to ground ($C_{gm}$), signal line mutual inductance to metallization ($L_{km}$), and metallization inductance ($L_m$). Therefore, the coupled tank LC values are adjusted to optimize the signal through the transmission line. FIG. 17 is a plot of unit capacitance (F/m) $C_{sg}$ v. Metallization Spacing (s) at a variety of vertical distances b and t. FIG. 18 is a plot of unit capacitance (F/m) $C_{sm}$ v. Metallization spacing. FIG. 19 is a plot of unit inductance (H/m) $L_s$ v. Metallization Spacing. FIG. 20 is a plot of unit inductance (H/m) $L_{ksm}$ v. Metallization. FIG. 21 is a plot of unit inductance (F/m) $L_m$ v. Metallization Spacing. These components $C_s$, $C_{sg}$, $L_s$, $L_{ksm}$, and $L_m$ are noted in the tank circuit 1435 of FIG. 15A.

Referring back to the structure of FIG. 16, it is possible to utilize the five plots in deriving appropriate unit capacitance and unit inductance values for a given layout of a signal transmission line and meta-material arranged according to an embodiment of the present invention. In an example design, the user is configuring a signal transmission line on a meta-substrate. The horizontal distance S for the metallization spacing s is defined at about 80 µm, the vertical distance T of the signal transmission line to the metallization is defined at 80 µm and the vertical distance B of the metallization to the voltage reference plane 1410 is defined at 80 µm, and the width W of the signal transmission line 1420 is about 60 µm. Within these predetermined parameters, the unit inductance and unit capacitance values may be read from the plots. These values provide a first order approximation providing a starting point to iterate to a more accurate solution. Table 1 depicts lists the values obtained. These values of capacitance and inductance are those that optimize signal transfer through the signal line, given the dimensions S, B, T, and W of the two-dimensional mode of FIG. 16.

The designer then calculates 2250 the equivalent rectangular-like shape RLC values for a given rectangle length and 2D cross section. He then uses 2260 desired rectangular-like shape RLC values in tank circuit and verifies signal response and manufacturability.

To obtain higher accuracy, it is recommended to verify 2270 the signal response using a three-dimensional high frequency simulator (e.g., HFSS) to verify the geometry of the rectangular-like shapes created from the 2D cross-sections really achieves the desired signal response for the meta-material. Further details in calculating $\in_R$ and $\mu_R$ may be found in a paper of Richard W. Ziolkowski "Design, Fabrication, and Testing of Double Negative Metamaterials" IEEE *TRANSACTIONS ON ANTENNAS AND PROPAGATION*, VOL. 51, NO. 7, JULY 2003, incorporated by reference in its entirety.

TABLE 1

Value of Capacitance/Inductance for Two-Dimensional Model

| S(µm) | B(µm) | T(µm) | $C_{sg}$(F/m) | $C_{sm}$(F/m) | $L_s$(H/m) | $L_{ksm}$(H/m) | $L_m$(H/m) |
|---|---|---|---|---|---|---|---|
| 100 | 100 | 100 | (AA) $2.16 \times 10^{-11}$ | (CC) $1.9 \times 10^{-11}$ | (DD) $6.30 \times 10^{-7}$ | (FF) $2.17 \times 10^{-7}$ | (HH) $5.30 \times 10^{-7}$ |
| 100 | 80 | 80 | (BB) $2.08 \times 10^{-11}$ | (CC) $1.9 \times 10^{-11}$ | (EE) $5.95 \times 10^{-7}$ | (GG) $1.96 \times 10^{-7}$ | (JJ) $4.96 \times 10^{-7}$ |

Likewise, it can be determined if the designer desires specific capacitance and inductance values (as indicated in the tank circuit 1435), the plots may be used to find the dimensions of S, B, T, and W. Table 1 example values are indicated for S=100 µm on FIGS. 17-21 with double letters AA, BB, CC, etc. The technique described may be programmed into a computer to calculate a range of dimensions and capacitance/inductance values. With a sufficient number of data points gathered, one may develop a series of equations to model the desired characteristics. The plots for FIGS. 17-21 are generated at an input frequency of 1 GHz.

A method 2200 of meta-material design using RLC data from two-dimensional electromagnetic meta-material (EM) models may be used to construct meta-material structures according to the present invention. To determine the geometric sizes and dimensions of the rectangular-like shapes (refer to FIG. 2) used to construct the metal material may follow the procedure outlined in the flowchart of FIG. 22.

The designer determines 2210 the application signal frequency band, signal line dimensions, and distance of the signal line from the voltage reference plane (usually ground plane). Next, the tank circuit as described in FIG. 15 is constructed 2220. The designer may decide whether to optimize 2230 the tank circuit RLC values for optimal signal response and then determine what rectangular-like geometry is needed to achieve tank circuit RLC values.

Alternatively, the user may create a table of tank circuit RLC values corresponding to producible rectangular-like geometry for the application. The desired signal response may not be readily observable using the circuit in FIG. 15A. Another circuit incorporating the signaling circuit from the die and the signal load may be needed to determine desired response. That circuit may resemble the circuit in FIG. 5 of the patent application or incorporate more application specific details.

The designer simulates 2240 two-dimensional (2D) cross sections to find either the desired RLC tank circuit values or create table 2245 of RLC values (e.g., Table 1) from known producible rectangular-like shapes derived from manufacturing design rules.

As a result of designing the meta-material, one can observe plots of the $\in_R$ and $\mu_R$ in a range of input frequencies. For a limited range of input frequency, the real component of the permeability $\mu_R$ may be observed going negative ($\mu_R < 0$). At a resonant frequency, the plots exhibit peaks.

Refer to FIG. 23. For the control material of a signal line on BT substrate, the permittivity and permeability are plotted over frequency. The permittivity and permeability have a real component and an imaginary component. The real components of $\in_R$ and $\mu_R$ do not go negative. At the resonant frequency peaks in the curves are observed.

Refer to FIG. 24. The real component of permeability of the signal line on meta-material goes negative (at 2410) in the frequency range of about 2.50 GHz to about 3.50 GHz. At resonant frequencies, peaks are noted in the curves of the component parts of $\in_R$ and $\mu_R$. Consequently, the effect of the meta-material provides for enhanced signal transfer and maintenance of more constant impedance over a useable frequency range. The performance of IC devices is therefore, enhanced.

While the present invention has been described with reference to several particular example embodiments, those skilled in the art will recognize that many changes may be made thereto without departing from the spirit and scope of the present invention, which is set forth in the following claims.

The invention claimed is:

1. A substrate configured as a meta-material, the meta-material providing noise protection for a signal line having a pre-determined length disposed on the meta-material, the substrate comprising:
   a dielectric material having a topside surface and an underside surface;
   a first conductive material arranged into pre-determined shapes having a collective length, the conductive material enveloped by the dielectric material, the conductive material disposed at a first predetermined distance from the topside surface and at a second predetermined distance from the underside surface, wherein the collective length of the conductive material is comparable to the pre-determined length of the signal line; and a second conductive material enveloped by the dielectric material, disposed at a third predetermined distance from the first conductive material.

2. The substrate as recited in claim 1, wherein the pre-determined shapes include an array consisting of a pattern of concentric shapes on a first plane each of the shapes having a length and width, the pattern of concentric shapes being disposed over the second conductive material, the second conductive material comprising a strip line having a length and width on a second plane.

3. The substrate as recited in claim 2, wherein the concentric shapes are regular polygons with a section of one side removed about a center point.

4. The substrate as recited in claim 3, wherein the concentric shapes are rectangular.

5. A substrate having a topside surface and an underside surface, the substrate configured as a meta-material, the meta-material providing noise protection for a signal line of pre-determined dimensions defined on the topside surface, the substrate comprising:

a conductive voltage reference plane defining the underside surface of a substrate;

a layer of conductive lines configured into pre-determined shapes, the layer of conductive lines disposed above the conductive voltage reference plane at a first pre-determined distance and the layer of conductive lines disposed at a second pre-determined distance below the signal line defined on the topside surface of the substrate, the layer of conductive lines including a series of concentric polygons;

a dielectric material enveloping the layer of conductive lines, the dielectric material bounded between the topside surface and underside surface of the substrate; and wherein the collective dimensions of the conductive lines are comparable to the pre-determined dimensions of the signal line.

6. The substrate as recited in claim 5, wherein the conductive voltage reference plane is a ground plane.

7. The substrate as recited in claim 6, wherein the layer of conductive lines includes on one plane the series of concentric polygons and on a second plane a strip, the concentric polygons and the strip at a third pre-determined distance from each other.

8. The substrate as recited in claim 7, wherein the concentric polygons are a number of rectangular shapes, each of the rectangular shapes having a notch defined therein and the notch in a first one of the rectangular shapes is opposite the notch in a subsequent one of the rectangular shapes.

9. The substrate as recited in claim 8, wherein the number of notched rectangular shapes is at least 2.

10. The substrate as recited in claim 9, wherein the number of notched rectangular shapes ranges from 2 to 9.

11. The substrate as recited in claim 9, wherein the notched rectangular shapes are squares.

12. A substrate having a topside surface and an underside surface, the substrate configured as a meta-material, the meta-material providing noise protection for a signal line of pre-determined dimensions defined on the topside surface, the substrate comprising:

a conductive ground plane defining the underside surface of the substrate;

a layer of conductive material configured into a plurality of pre-determined shapes wherein some conductive material is absent, and the layer of conductive material disposed above the conductive ground plane at a first pre-determined distance and the layer of the conductive material disposed at a second pre-determined distance below the signal line defined on the topside surface of the substrate;

a dielectric material enveloping the layer of the conductive material, the dielectric material bounded between the topside surface and underside surface of the substrate; and wherein the collective dimensions of the plurality of pre-determined shapes are comparable to the pre-determined dimensions of the signal line.

13. The substrate as recited in claim 12, wherein the plurality of pre-determined shapes includes a number of concentric rectangular shapes.

14. The substrate as recited in claim 13, wherein the number of concentric rectangular shapes is at least 2.

15. The substrate as recited in claim 14, where the number of concentric rectangular shapes ranges from 2 to 9.

16. The substrate as recited in claim 14, wherein the concentric rectangular shapes are squares, each of the squares having a notch defined therein and the notch in a first one of the squares is opposite the notch in a subsequent one of the squares.

17. A substrate having a topside surface and an underside surface, the substrate configured as a meta-material, the meta-material providing noise protection for a signal line of pre-determined dimensions defined on the topside surface, the substrate comprising:

a conductive ground plane defining the underside surface of the substrate;

a layer of a conductive material configured into a first rectangle and a second rectangle, the first and second rectangles being concentric, each rectangle having a notch defined on a side about a midpoint and the notch in the first rectangle is opposite the notch in the second rectangle, the first rectangle having a smaller perimeter than the second rectangle, and the layer of conductive material disposed above the conductive ground plane at a first pre-determined distance and the layer of the conductive material disposed at a second pre-determined distance below the signal line defined on the topside surface of the substrate;

a dielectric material enveloping the layer of the conductive material, the dielectric material bounded between the topside surface and underside surface of the substrate; and wherein the collective dimensions of the first and second rectangles are comparable to the pre-determined dimensions of the signal line.

18. The substrate as recited in claim 17, wherein the layer of a conductive material includes an additional inside rectangle having a smaller perimeter than the first rectangle and an additional four outside rectangles each having an incrementally greater perimeter than the perimeter of the second rectangle.

19. The substrate as recited in claim 17 wherein the first and second rectangles are squares.

20. The substrate as recited in claim 17, wherein the layer of a conductive material consists of a metallization sheet, the metallization sheet being configured into plurality rectangles wherein some conductive material is absent.

21. The substrate as recited in claim 19, wherein the layer of a conductive material consists of a metallization sheet, the metallization sheet being configured into rectangles wherein conductive material is absent.

22. The substrate as recited in claim 19, wherein a strip line having a length comparable to a length of an outermost rectangle of the additional four outside rectangles, is situated between the conductive layer and the conductive ground plane, the strip line near the conductive layer, the strip line running underneath the notch of each of the rectangles, the strip line having a width comparable to a width of the notch of each of the rectangles.

* * * * *